United States Patent
Shah et al.

(10) Patent No.: US 9,720,619 B1
(45) Date of Patent: Aug. 1, 2017

(54) SYSTEM AND METHODS FOR EFFICIENT SNAPSHOTS IN A DISTRIBUTED SYSTEM OF HYBRID STORAGE AND COMPUTE NODES

(71) Applicant: Springpath, Inc., Sunnyvale, CA (US)

(72) Inventors: Smit Shah, Sunnyvale, CA (US); Sandip Agarwala, Cupertino, CA (US); Mallikarjunan Mahalingam, Cupertino, CA (US); Faraz Shaikh, Sunnyvale, CA (US); Praveen Vegulla, Cupertino, CA (US); Krishna Yadappanavar, Sunnyvale, CA (US)

(*) Notice: Subject to any disclaimer, the term of this patent is extended or adjusted under 35 U.S.C. 154(b) by 141 days.

(21) Appl. No.: 14/135,500

(22) Filed: Dec. 19, 2013

Related U.S. Application Data

(60) Provisional application No. 61/739,685, filed on Dec. 19, 2012.

(51) Int. Cl.
*G06F 3/06* (2006.01)
*G06F 12/02* (2006.01)

(52) U.S. Cl.
CPC ............ *G06F 3/065* (2013.01); *G06F 3/0614* (2013.01); *G06F 3/0689* (2013.01); *G06F 12/0292* (2013.01)

(58) Field of Classification Search
CPC ...... G06F 3/0614; G06F 3/0619; G06F 3/065; G06F 3/067; G06F 12/0292; G06F 2212/154; G06F 2212/263
See application file for complete search history.

(56) References Cited

U.S. PATENT DOCUMENTS

| | | |
|---|---|---|
| 5,692,185 A | 11/1997 | Nilsen |
| 6,247,139 B1 | 6/2001 | Walker et al. |
| 6,338,117 B1 | 1/2002 | Challenger |
| 7,194,492 B2 | 3/2007 | Seidenberg |
| 7,246,211 B1 * | 7/2007 | Beloussov .......... G06F 11/1461 707/999.2 |

(Continued)

OTHER PUBLICATIONS

"The Case for Persistent Full Clones," Deepstorage.net, http://getgreenbytes.com/wp-content/uploads/2013/05/FULL_CLONE_PERSISTENT_VDI-FINAL.pdf, 18 pages.

(Continued)

*Primary Examiner* — Hal Schnee
(74) *Attorney, Agent, or Firm* — Blakely, Sokoloff, Taylor & Zafman LLP

(57) ABSTRACT

A distributed snapshot in a distributed storage system is described, where the storage controller functions of the distributed storage system are separated from that of distributed storage system storage media. In an exemplary embodiment, a storage controller server receives a request to create the snapshot in the distributed storage system, where the distributed storage system includes a plurality of virtual nodes and a plurality of physical nodes, and the source object includes a plurality of stripes. The storage controller server further determines a set of virtual nodes from the plurality of virtual nodes, where each of the set of virtual nodes owns one of the plurality of stripes of the source object. For each of the set of virtual nodes, the storage controller server sends a clone request to that virtual node, where the request is to create a snapshot for the stripe hosted by that virtual node.

16 Claims, 19 Drawing Sheets

(56) References Cited

U.S. PATENT DOCUMENTS

| | | | |
|---|---|---|---|
| 7,395,378 B1* | 7/2008 | Pendharkar | G06F 11/2082 |
| | | | 711/100 |
| 7,467,265 B1* | 12/2008 | Tawri | G06F 12/0813 |
| | | | 711/161 |
| 7,757,202 B2 | 7/2010 | Dahlstedt | |
| 7,953,774 B2 | 5/2011 | Cong | |
| 8,190,823 B2 | 5/2012 | Waltermann | |
| 8,429,162 B1 | 4/2013 | Wang et al. | |
| 8,589,640 B2 | 11/2013 | Colgrove | |
| 8,832,039 B1 | 9/2014 | Sorenson | |
| 8,935,302 B2 | 1/2015 | Flynn | |
| 9,098,201 B2 | 8/2015 | Benjamin | |
| 9,110,792 B1 | 8/2015 | Douglis | |
| 9,201,794 B2 | 12/2015 | Gill | |
| 9,251,021 B2 | 2/2016 | Calder | |
| 2001/0052073 A1 | 12/2001 | Kern et al. | |
| 2003/0014599 A1 | 1/2003 | McBrearty et al. | |
| 2003/0189930 A1 | 10/2003 | Terrell et al. | |
| 2004/0098424 A1 | 5/2004 | Seidenberg | |
| 2004/0243650 A1* | 12/2004 | McCrory | G06F 9/5061 |
| 2005/0071550 A1 | 3/2005 | Lowe | |
| 2005/0114402 A1* | 5/2005 | Guthrie, II | G06F 3/0608 |
| 2005/0193272 A1* | 9/2005 | Stager | G06F 11/2074 |
| | | | 714/42 |
| 2005/0268054 A1 | 12/2005 | Werner et al. | |
| 2008/0109624 A1 | 5/2008 | Gilbert | |
| 2009/0089537 A1* | 4/2009 | Vick | G06F 12/1072 |
| | | | 711/203 |
| 2009/0292746 A1 | 11/2009 | Bricker et al. | |
| 2010/0064110 A1 | 3/2010 | Boettcher | |
| 2010/0070715 A1 | 3/2010 | Waltermann | |
| 2010/0082550 A1 | 4/2010 | Cong | |
| 2010/0191783 A1* | 7/2010 | Mason | G06F 17/30088 |
| | | | 707/822 |
| 2010/0198795 A1* | 8/2010 | Chen | G06F 3/0605 |
| | | | 707/674 |
| 2010/0235335 A1 | 9/2010 | Heman | |
| 2011/0196900 A1 | 8/2011 | Drobychev | |
| 2011/0225214 A1 | 9/2011 | Guo | |
| 2011/0258480 A1 | 10/2011 | Young et al. | |
| 2011/0265085 A1* | 10/2011 | Kedem | G06F 9/45558 |
| | | | 718/1 |
| 2011/0282842 A1* | 11/2011 | Popovski | G06F 11/1435 |
| | | | 707/649 |
| 2012/0047111 A1* | 2/2012 | Hayden | G06F 17/30088 |
| | | | 707/649 |
| 2012/0137054 A1 | 5/2012 | Sadri | |
| 2012/0210095 A1 | 8/2012 | Nellans et al. | |
| 2012/0278512 A1 | 11/2012 | Alatorre et al. | |
| 2012/0297142 A1 | 11/2012 | Gill | |
| 2012/0303577 A1 | 11/2012 | Calder | |
| 2012/0331249 A1 | 12/2012 | Benjamin | |
| 2013/0097380 A1 | 4/2013 | Colgrove et al. | |
| 2013/0297569 A1 | 11/2013 | Hyde, II | |
| 2014/0040199 A1* | 2/2014 | Golab | G06F 17/30309 |
| | | | 707/634 |
| 2014/0122795 A1 | 5/2014 | Chambliss | |
| 2014/0143213 A1 | 5/2014 | Tal | |
| 2015/0039717 A1 | 2/2015 | Chiu et al. | |

OTHER PUBLICATIONS

Rodeh, Ohad, "B-trees, Shadowing, and Clones," *ACM Transactions on Storage (TOS)* 3, No. 4, https://www.usenix.org/legacy/events/lsf07/tech/rodeh.pdf, (2008), 51 pages.

Rodeh, Ohad, "B-trees, Shadowing, and Clones," *ACM Transactions on Computational Logic*, vol. V, No. N, (Aug. 2007), 26 pages.

VMWare Virtual SAN Hardware Guidance—VMWare, Jun. 2009 https://www.vmware.com/files/pdf/products/vsan/VMware-TMD-Virtual-SAN-Hardware-Guidance.pdf.

Shaoshan Liu et al.,"Parker: Parallel Gargage Collerctor Based on Virtual Spaces", Computers, IEEE Transactions on Year: 2012, vol. 6, Issue: 11, pp. 1611-1623, DOI: 10.1109/TC.2011.193.

Giuseppe Decandia et al., Dynamo: Amazon's Highly Available Key-value Store, http://www.allthingsdistributed.com/files/amazon-dynamo-sosp2007.pdf, SOSP'07, Oct. 14-17, 2007, pp. 205-220, Stevenson, Washington, USA, Amazon.com.

Avinash Lakshman et al.,Cassandra—A Decentralized Structured Storage System, http://www.cs.cornell.edu/projects/ladis2009/, Oct. 10, 2009, 6 pages.

John S. Heidemann et al., File-System Development With Stackable Layers, https://www.ece.cmu.edu/~ganger/712.fall02/papers/stackableFS-Heidemann94.pdf, ACM Transactions on Computer Systems, vol. 12, No. 1 Feb. 1994 pp. 58-89.

* cited by examiner

SYSTEM AND METHODS FOR EFFICIENT SNAPSHOTS IN A DISTRIBUTED SYSTEM OF HYBRID STORAGE AND COMPUTE NODES

RELATED APPLICATIONS

Applicant claims the benefit of priority of prior, provisional application Ser. No. 61/739,685, filed Dec. 19, 2012, the entirety of which is incorporated by reference.

FIELD OF INVENTION

This invention relates generally to a storage system and more particularly to distributed snapshots in a distributed storage system.

BACKGROUND OF THE INVENTION

Enterprise storage systems currently available are proprietary storage appliances that integrate the storage controller functions and the storage media into the same physical unit. This centralized model makes it harder to independently scale the storage systems' capacity, performance and cost. Users can get tied to one expensive appliance without the flexibility of adapting it to different application requirements that may change over time. For small and medium scale enterprise, this may require huge upfront capital cost. For larger enterprise datacenters, new storage appliances are added as the storage capacity and performance requirements increase. These operate in silos and impose significant management overheads.

Enterprise storage system can support snapshots, a snapshot is a read-only copy of file at a given point in time. Snapshots have a variety of uses: recovering accidentally deleted files, reverting back to known good state of the file-system after corruption, data mining, backup, and more. Clones, or writeable-snapshots, are an extension of the snapshot concept where the snapshot can also be overwritten with new data. A clone can be used to create a point in time copy of an existing volume and to try out experimental software. In a virtualized environment (e.g. VMWARE, VSPHERE), the whole virtual machine could be snapshotted by dumping the entire virtual machine state (memory, CPU, disks, etc.) to a set of files.

Snapshots are supported by many file-systems. Clones are a more recent user requirement that is widely being adopted especially in a virtualized environment (e.g., virtual desktop infrastructure (VDI)). Continuous Data Protection (CDP) is a general name for storage systems that have the ability to keep the entire history of a volume. CDP systems support two main operations: (1) going back in time to any point in history in read-only mode; and (2) reverting back to a previous point in time and continuing update from there. CDP systems differ in the granularity of the history they keep. Some systems are able to provide a granularity of every input/output (I/O), others, per second, still others, per hour. Supporting a large number of clones is a method of implementing coarse granularity CDP.

There are many different approaches known for performing snapshots (e.g., redo logs, full snapshots/clones, linked clones, and refcounting). For example, redo logging involves creating a differencing disk for each snapshot taken. For redo logging, all the new updates would get logged into the differencing disk and current disk would be served in the read only mode. This approach has the following limitations in that, for every read operation, the storage system first has to lookup if the differencing disk has the data, else it looks for the data in it's parent and so on. Each of these lookup operations is an on-disk read in the worst case, which means as the number of the snapshots increase the read performance would degrade. In addition, redo logging creates an artificial limit set on the number of snapshots that could be created in order to make sure that performance does not degrade any further. Further, for redo logging, deletion of snapshot is expensive because snapshot deletion involves consolidating the differencing-disk to it's parent, which is an expensive operation and has more space requirements at least temporarily. The consolidation is done in order to not impact the read performance degradation mentioned above. In addition, redo logging involves overwriting the same data again taking more space.

Another way to support snapshots is to create a complete new copy of the file/volume. This is both expensive and consumes a lot of space. Doing compression and deduplication could still save space but the creation time is the main bottleneck for this approach.

Using linked clones is another mechanism for supporting clones of virtual machines, especially in VDI environments. Linked clones are supported on top of redo log based snapshot as mentioned above. Linked clones, however, have the same set of problems mentioned above, without the consolidation problem mentioned above. In addition, as the differencing disk grows with the new data all the space saved using the linked clones is gone. They are mostly used in the VDI environment.

Finally, refcounting based snapshots involves bumping the refcount of each block in the system at the creation (with the optimization as mentioned in the paper) and when the snapshoted file's block is modified, the system does a copy on write or redirect on write depending upon the implementation and layout. Such an implementation does not work well as is for hybrid distributed storage as this would involve syncing the whole write log to disk before taking the snapshot or clone. Also some of some of the solutions only provide volume level snapshots or clones.

Other solutions that do offer file level snapshots/clones have some limitations on the number of snapshots or clones that can be created. In addition, these solutions have the problem that creation or deletion is an expensive operation, which requires more overhead to the storage system.

SUMMARY OF THE DESCRIPTION

A distributed snapshot in a distributed storage system is described, where the storage controller functions of the distributed storage system are separated from that of distributed storage system storage media. In an exemplary embodiment, a storage controller server receives a request to create the snapshot in the distributed storage system, where the distributed storage system includes a plurality of virtual nodes and a plurality of physical nodes, and the source object includes a plurality of stripes. The storage controller server further determines a set of virtual nodes from the plurality of virtual nodes, where each of the set of virtual nodes owns one of the plurality of stripes of the source object. For each of the set of virtual nodes, the storage controller server sends a clone request to that virtual node, where the request is to create a snapshot for the stripe hosted by that virtual node.

In a further embodiment, the storage controller server receives a request to read the data at one of a plurality of virtual nodes of the distributed storage system. The storage controller server further looks up an inode in an in-memory delta tree, where the delta tree captures modifications to the distributed storage system that are logged in a write log. In addition, the storage controller server reads the data stored in the distributed storage system using keys from a delta-delta tree, wherein the delta-delta tree captures the modifications to the current delta tree since the time the snapshot was taken.

Other methods and apparatuses are also described.

BRIEF DESCRIPTION OF THE DRAWINGS

The present invention is illustrated by way of example and not limitation in the figures of the accompanying drawings in which like references indicate similar elements.

DETAILED DESCRIPTION

Figure 1:
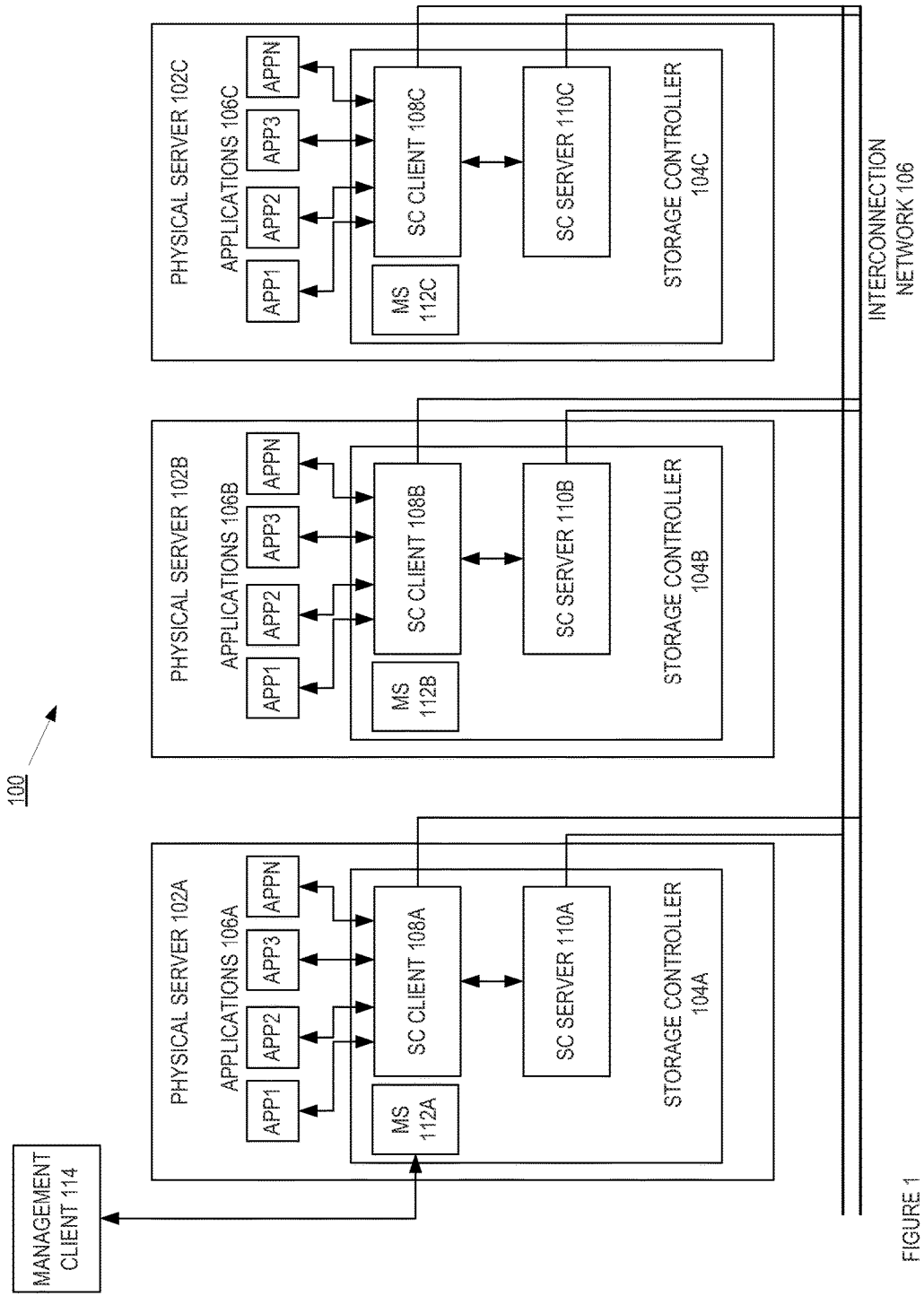
FIG. 1 is an illustration of one embodiment of a high-level view of StorFS system.

A distributed snapshot in a distributed storage system is described, where the storage controller functions of the distributed storage system are separated from that of distributed storage system storage media. In the following description, numerous specific details are set forth to provide thorough explanation of embodiments of the present invention. It will be apparent, however, to one skilled in the art, that embodiments of the present invention may be practiced without these specific details. In other instances, well-known components, structures, and techniques have not been shown in detail in order not to obscure the understanding of this description.

Reference in the specification to "one embodiment" or "an embodiment" means that a particular feature, structure, or characteristic described in connection with the embodiment can be included in at least one embodiment of the invention. The appearances of the phrase "in one embodiment" in various places in the specification do not necessarily all refer to the same embodiment.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

The processes depicted in the figures that follow, are performed by processing logic that comprises hardware (e.g., circuitry, dedicated logic, etc.), software (such as is run on a general-purpose computer system or a dedicated machine), or a combination of both. Although the processes are described below in terms of some sequential operations, it should be appreciated that some of the operations described may be performed in different order. Moreover, some operations may be performed in parallel rather than sequentially.

The terms "server," "client," and "device" are intended to refer generally to data processing systems rather than specifically to a particular form factor for the server, client, and/or device.

A distributed snapshot mechanism in a distributed storage system is described, where the storage controller functions of the distributed storage system are separated from that of distributed storage system storage media. Currently, as more and more datacenters are virtualized, virtual machine snapshotting and cloning has become a very important feature. In one embodiment, a snapshot is a copy of a source object stored in the StorFS system. The object can be one or more files, directories, volumes, filesystems, and/or a combination thereof. The snapshot can be a read-only or writeable. In addition, a clone is a writeable snapshot.

The most time and space consuming for virtual machine cloning or snapshotting is the cloning of the virtual disk. In addition, with the adoption of virtualized infrastructure, there is a requirement to support fast creation as well as deletion of thousands of snapshots/clones without impacting the performance with efficient space usage. Supporting all the above requirements in a hybrid, shared nothing, distributed storage solution is challenging given the fact that the update operations (e.g. operations that modify the on-disk state, such as write or set attribute operations) are logged into a write log and, at periodic intervals, synced to the backend storage.

Also another challenge to is support the snapshots at the granularity of file, which is striped across "n" number of stripes. This involves requiring a distributed snapshot support across all the nodes hosting the stripe of the file. In addition, another problem is to checkpoint the state of the file given that some partial data is sitting in the write log and some in the backend storage. Waiting for syncing all the dirty data (even the ones belonging to other files) to the backend storage and then checkpointing the file would take a lot of time and eventually provide a very bad user experience given that there is requirement on supporting thousands of snapshots/clones in virtualized environments.

Another challenge is how to efficiently handle future updates to the source and destination (incase of writeable snapshot) in order to maintain a consistent state of both the source and snapshot without affecting the read/write performance.

In one embodiment, the StorFS system can create snapshots efficiently, with a high degree of granularity, for source objects on one storage server controller or distributed across many storage controller servers, and has the ability to snapshots source objects that are both in the write log and persistent storage. For example and in one embodiment, the StorFS system has the ability to create or delete large number of snapshots without consuming many resources (disk space, memory, CPU, etc.) and in a short amount of time. In this embodiment, creation of snapshots does not significantly negatively impact the I/O performance. In addition, the StorFS system has the ability to snapshot an individual file, a set of files or directories or an entire file system. Furthermore, the StorFS system has the ability to take the snapshot of the files that may be spread across multiple physical nodes and disks, each receiving concurrent updates. The StorFS system additionally has the ability to, where new data is staged in a temporary write cache (also known as write log) before being transferred to the persistent storage, capture point in time state of both the write log and the persistent storage of the object(s) in a snapshot. There is a storage controller server running on each physical node (pNodes) in the cluster and each physical node owns a set of virtual nodes (vNodes). There is a special namespace (NS) vNode, which controls the namespace related operations. In addition, there are filetree (FT) vNodes that hosts the stripes (parts of data) of a given object. In one embodiment, a storage controller server on the pNode owning the namespace vNode receives a request to create the snapshot in the distributed storage system, where the distributed storage system includes a plurality of virtual nodes and a plurality of physical nodes, and the source object includes a plurality of stripes. The NS vNode further determines a set of FT virtual nodes from the plurality of virtual nodes, where each of the set of virtual nodes owns one of the plurality of stripes of the source object. For each of the set of virtual nodes, the NS vNode sends a snapshot request to that FT virtual node, where the request is to create a snapshot for the stripe hosted by that virtual node. The request to create a snapshot on the FT vNode freezes the current in-memory delta tree state of the source object stripe that is being cloned. Any further modification to the source object or the snapshot involves creating the delta-delta tree that represents the changes made to the source object or snapshot since the snapshot was taken. Any future query operations on the FT vNodes are served by scanning through the chain of delta-delta trees. In summary, the delta tree captures the modification to the on-disk storage that is logged into the write log. The delta-delta tree captures the modifications to the current delta tree since the time the snapshot was taken. A chain of in-memory delta-delta tree could be created as well if snapshots are taken after some modification to the source or the snapshot without involving a flush.

In the further embodiment, the storage controller server receives a request to read the data at one of the plurality of virtual nodes of the distributed storage system. The storage controller server scans through the chain of delta-delta tree for the write logs and on-disk data to serve the data requested.

In one embodiment, the StorFS system uses techniques to efficiently track changes in a distributed setting. For example and in one embodiment, the StorFS is capable of performing low overhead data services at different level of granularity: from the file system level to the individual files level. In this embodiment, the StorFS system stripes file and file system data across multiple storage nodes in our cluster. Snapshotting a file, for example, involves creating a small metadata entry in the storage vNodes containing that file. This stripe process is extremely fast and require minimal amount of resources. There is no data copy involved. Furthermore, the StorFS permits creating large number of snapshots (or clones) without any deterioration in performance. The snapshotting approach uses an efficient mechanism such that when the snapshot create or delete request arrives, the StorFS system does not have to sync the current write log to the backend storage and also the following update operations to the original object as well as snapshots are handled efficiently to keep a consistent state of both original object and clone[s].

As a result, thousands of snapshots can be created/deleted in few seconds in a hybrid shared nothing, distributed storage. This snapshot mechanism is at the granularity of file, which is striped across different physical nodes. There is no need of consolidation at the time of deletion and free space management is done.

In one embodiment, the StorFS system uses an in-memory delta-delta tree to checkpoint a file or other stored object so that there is no need to do a premature write log sync to disk. In this embodiment, the specific portion of the delta tree involving that object is checkpointed which is an in-memory operation. As a result, no other components of the storage system are affected. The delta-delta tree captures the modifications to the current delta tree since the time the snapshot was taken. At the regular write log sync intervals, the whole in-memory delta-delta tree can be merged and flushed to the disk, which would save the system from overwriting the same data twice. In one embodiment, there is no read/write performance degradation with any number of snapshots.

In one embodiment, the StorFS system can save space using compression and deduplication on top of snapshots. In a VDI environment, most of the users end up running the same of set of applications, which provide a lot of room for deduplication across all the snapshots.

FIG. 1 is an illustration of one embodiment of a high-level view of StorFS system 100. In FIG. 1, the StorFS system 100 includes storage nodes 102A-C coupled by an interconnection network 116. While in one embodiment, three storage nodes 102A-C are illustrated as part of the StorFS system 100, in alternate embodiments, there can be more or less storage nodes. For example and in one embodiment, the StorFS system 100 can include up to several hundred storage nodes. In one embodiment, each storage node 102A-C includes a storage controller (SC) client (also called dispatcher) 108A-C, a storage controller (SC) server 110A-C, or both. The SC servers 110A-C manage their underlying storage (e.g., Hard disk drive (HDD), Solid state drives (SSD), PCIe flash, etc.) and collectively provide reliable and unified storage functionality to the SC clients. The SC client 108A-C processes input/output (I/O) requests from the applications that are local to its physical storage node and routes them to the appropriate SC servers for processing. For example and in one embodiment, SC client 108A can send an I/O request locally to SC Server 110A and/or remotely to SC Servers 110B or 110C. The system is capable of exposing many different interfaces to the application like file (e.g. NFS, CIFS), object, key-value, or another type of interface. In one embodiment, the storage node 102A-C can be server, blade server, personal computer, or any other type of device capable of storing data. In one embodiment, the management server 112A-C is an agent that is used to communicate system management data and commands regarding the corresponding storage node 102A-C with the management client 114.

In one embodiment, the design of the StorFS system 100 distributes both the data and the metadata, and this system 100 does not require storing a complete global map for locating individual data blocks in our system. The responsibility of managing metadata is offloaded to each individual storage nodes 102A-C. In one embodiment, a cluster manager (CRM) resides on each SC Server 110 maintains some global metadata, which is small compared to the local metadata. In one embodiment, each logical file (or entity) is partitioned into equal sized "stripe units". The location of a stripe unit is determined based on a mathematical placement function Equation (1):

$$\text{Virtual\_Node\#} = \text{Hash}(\text{Entity}_{Id}, \text{Stripe\_Unit\#})\%\text{Total\_Vitual\_Nodes} \quad (1)$$

$$\text{Stripe\_Unit\#} = \frac{\text{offset}}{\text{Stripe\_Unit\_Size}}\%\text{Stripe\_Unit\_Per\_Stripe}$$

The $\text{Entity}_{Id}$ is an identification of a storage entity that is to be operated upon, the Total_Virtual_Nodes is the total number of virtual nodes in the StorFS system 100, the offset is an offset into the storage entity, and the Stripe_Unit_Size is the size of each stripe unit in the StorFS system 100. The value Stripe_Unit_Per_Stripe is described further below. In one embodiment, the storage entity is data that is stored in the StorFS system 100. For example and in one embodiment, the storage entity could be a file, an object, key-value pair, etc. In this example, the $\text{Entity}_{Id}$ can be an iNode value, a file descriptor, an object identifier, key/value identifier, etc. In one embodiment, an input to a storage operation is the $\text{Entity}_{Id}$ and the offset (e.g., a write, read, query, create, delete, etc. operations). In this embodiment, the $\text{Entity}_{Id}$ is a globally unique identification.

In one embodiment, the StorFS 100 system receives the $\text{Entity}_{Id}$ and offset as input for each requested storage operation from an application 106A-C. In this embodiment, the StorFS system 100 uses the offset to compute a stripe unit number, Stripe_Unit#, based on the stipe unit size, Stripe_Unit_Size, and the number of virtual nodes that the entity can be spread across, Stripe_Unit_Per_Stripe. Using the stripe unit number and the entity identifier ($\text{End}/y_{Id}$), the StorFS system 100 computes the virtual node identifier. As described below, the StorFS system 100 uses a hash function to compute the virtual node identifier. With the virtual node identifier, the StorFS 100 can identify which physical node the storage entity is associated with and can route the request to the corresponding SC server 110A-C.

In one embodiment, each vNode is a collection of either one or more data or metadata objects. In one embodiment, the StorFS system 100 does not store data and metadata in the same virtual node. This is because data and metadata may have different access patterns and quality of service (QoS) requirements. In one embodiment, a vNode does not span across two devices (e.g. a HDD). A single storage disk of a storage node 102A-C may contain multiple vNodes. In one embodiment, the placement function uses that a deterministic hashing function and that has good uniformity over the total number of virtual nodes. A hashing function as known in the art can be used (e.g., Jenkins hash, murmur hash, etc.). In one embodiment, the "Stripe_Unit_Per_Stripe" attribute determines the number of total virtual nodes that an entity can be spread across. This enables distributing and parallelizing the workload across multiple storage nodes (e.g., multiple SC servers 110A-C). In one embodiment, the StorFS system 100 uses a two-level indexing scheme that maps the logical address (e.g. offset within a file or an object) to a virtual block address (VBA) and from the VBAs to physical block address (PBA). In one embodiment, the VBAs are prefixed by the ID of the vNode in which they are stored. This vNode identifier (ID) is used by the SC client and other StorFS system 100 components to route the I/O to the correct cluster node. The physical location on the disk is determined based on the second index, which is local to a physical node. In one embodiment, a VBA is unique across the StorFS cluster, where no two objects in the cluster will have the same VBA.

In one embodiment, the CRM maintains a database of virtual node (vNode) to physical node (pNode) mapping. In this embodiment, each SC client and server caches the above mapping and computes the location of a particular data block using the above function in Equation (1). In this embodiment, the cluster manager need not be consulted for every I/O. Instead, the cluster manager is notified if there is any change in 'vNode' to 'pNode' mapping, which may happen due to node/disk failure, load balancing, etc. This allows the StorFS system to scale up and parallelize/distribute the workload to many different storage nodes. In addition, this provides a more deterministic routing behavior and quality of service. By distributing I/Os across different storage nodes, the workloads can take advantage of the caches in each of those nodes, thereby providing higher combined performance. Even if the application migrates (e.g. a virtual machine migrates in a virtualized environment), the routing logic can fetch the data from the appropriate storage nodes. Since the placement is done at the stripe unit granularity, access to data within a particular stripe unit goes to the same physical node. Access to two different stripe units may land in different physical nodes. The striping can be configured at different level (e.g. file, volume, etc.) Depending on the application settings, the size of a stripe unit can range from a few megabytes to a few hundred megabytes. In one embodiment, this can provide a good balance between fragmentation (for sequential file access) and load distribution.

In another embodiment, the StorFS system uses the concept of virtual node (vNode) as the unit of data routing and management. In one embodiment, there are four types of vNode:

Namespace vNode: A vNode that is associated with the routing and storage of the StorFS file system namespace (directory structure, file names, etc.) metadata.

FileTree vNode: A vNode that is associated with the routing and storage of the StorFS 'File Tree' metadata. File tree metadata is used to locate the data on the persistent storage.

Data vNode: A vNode that is associated with the routing and storage of the data

Cache vNode: A vNode that is associated with the routing of the client IOs from SC client to one of the SC servers. Multiple cache vNodes are grouped together to form an abstraction called 'Write Log Group', where updates from the clients are logged.

Namespace and FileTree vNodes are collectively called metadata vNodes. In one embodiment, there is a one-to-one correspondence between the metadata vNodes and the cache vNodes; i.e. for every metadata vNode, there exists one and only one cache vNode. In another embodiment, there can be a many to one relationship between metadata vNodes and cache vNodes (and vice versa). The number of metadata and cache vNodes is specified as a configuration parameter during the cluster creation and this number remains fixed for the entire lifecycle of the cluster. In one embodiment, data vNodes are created on demand when new data is written to the StorFS system. For the purpose of resiliency and high availability, the StorFS system introduces enough redundancy (e.g., RAID-1) to recover from failures. The redundancy level is configurable based on user-defined policies. Cache vNodes can only be placed on storage devices that allow fast random access like SSD, flash, NVRAM, etc. Data and metadata vNodes can be placed on any non-volatile persistent storage like HDD, SSD, etc.

Figure 2:
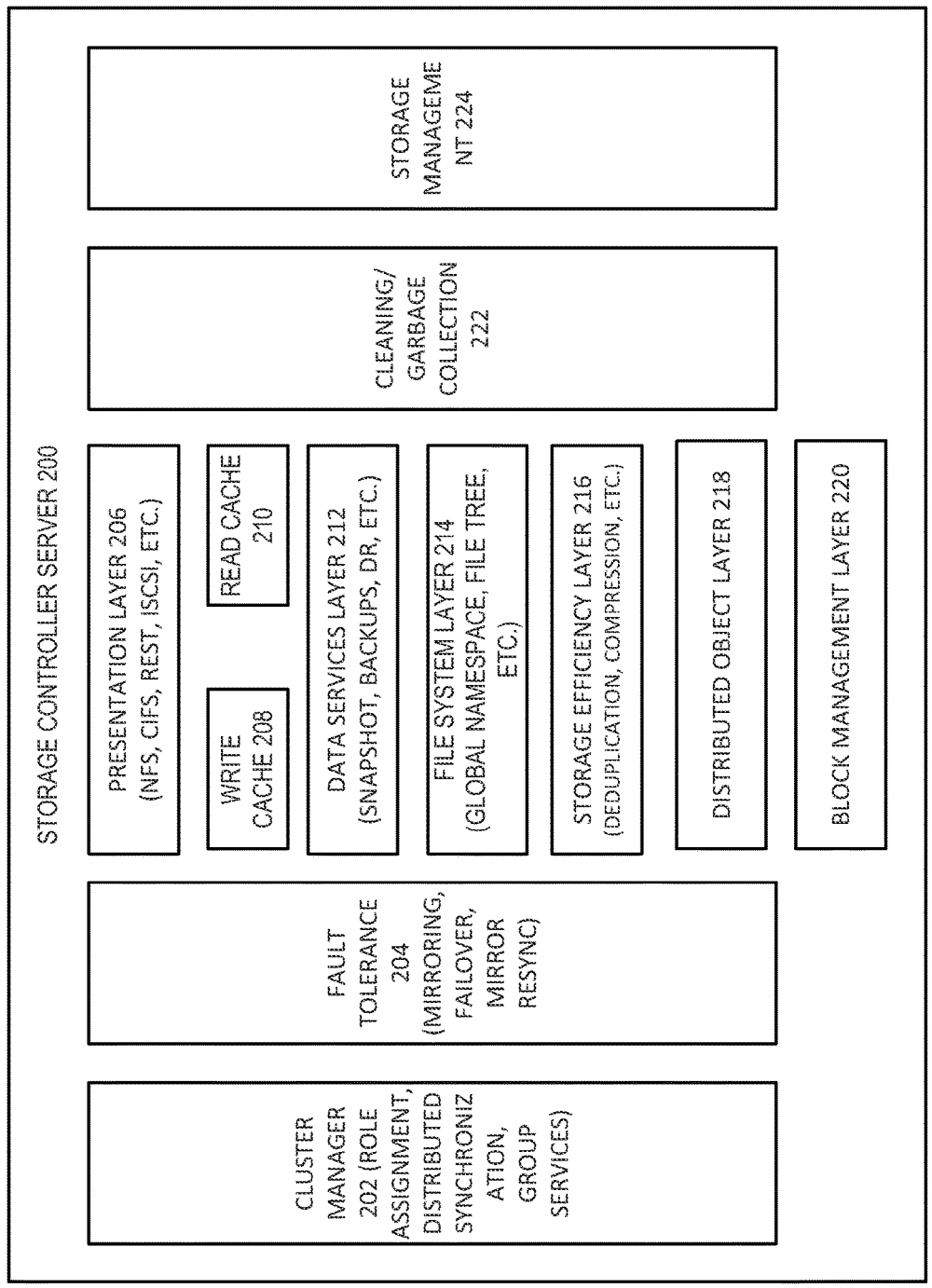
FIG. 2 is an illustration of one embodiment of a system including some of the components that comprises the storage controller server.

FIG. 2 is a block diagram of one embodiment of a storage control server 200. In one embodiment, the Block Management Layer 220 of the storage control server is responsible for formatting, allocating, and freeing storage in fixed block sizes. This layer provides access to different kinds of storage (e.g. SSD, HDD, etc.) in the system. In one embodiment, the Distributed Object Layer 218 of the storage control server uses an API of the Block Management Layer 220 to provide a global distributed object namespace that is accessible over the network. In one embodiment, the Storage Efficiency Layer 216 reduces the size of data footprint on the physical medium using techniques like compression, deduplication, etc. The reduction is achieved without deteriorating the performance or the reliability of the data storage. In one embodiment, the File System Layer 214 provides a logical global namespace abstraction to organize and locate data in the cluster. In one embodiment, the Data Service Layer 212 provides enterprise data services like disaster recovery, fine grained policy management, snapshots/clones, etc. In one embodiment, the Write Cache 208 and the Read Cache 210 Layers provide acceleration for write and read I/O respectively using fast storage devices. In one embodiment, the Write Cache Layer 208 includes the write log as described below. In one embodiment, the Presentation Layer 206 provides an interface to access the StorFS storage using well-known standard protocols like NFS, CIFS, REST, iSCSI, etc. In one embodiment, the Cluster Manager (CRM) Layer 202 is responsible for the coordination across distributed StorFS components, delegating responsibilities and maintaining a consistent global state of the system. In one embodiment, the Fault Tolerance Layer 204 is responsible for resiliency and making sure that the data is available and consistent even after the failure of a software or hardware component (disk, server, network, etc.). In one embodiment, the Garbage Collection Layer 222 is responsible for reclaiming dead space that result due to entities getting deleted or updated. This layer efficiently determines the storage blocks that are not used (or referenced) and makes them available for new data to be written. In one embodiment, the Storage Management Layer 224 provides a framework to configure, monitor, analyze and report on the operation of the overall StorFS cluster storage system as well as individual logical and physical entities in the cluster. In one embodiment, each of the layers mentioned above are fully distributed and each layer does not rely on any centralized components for their operations.

Figure 3:
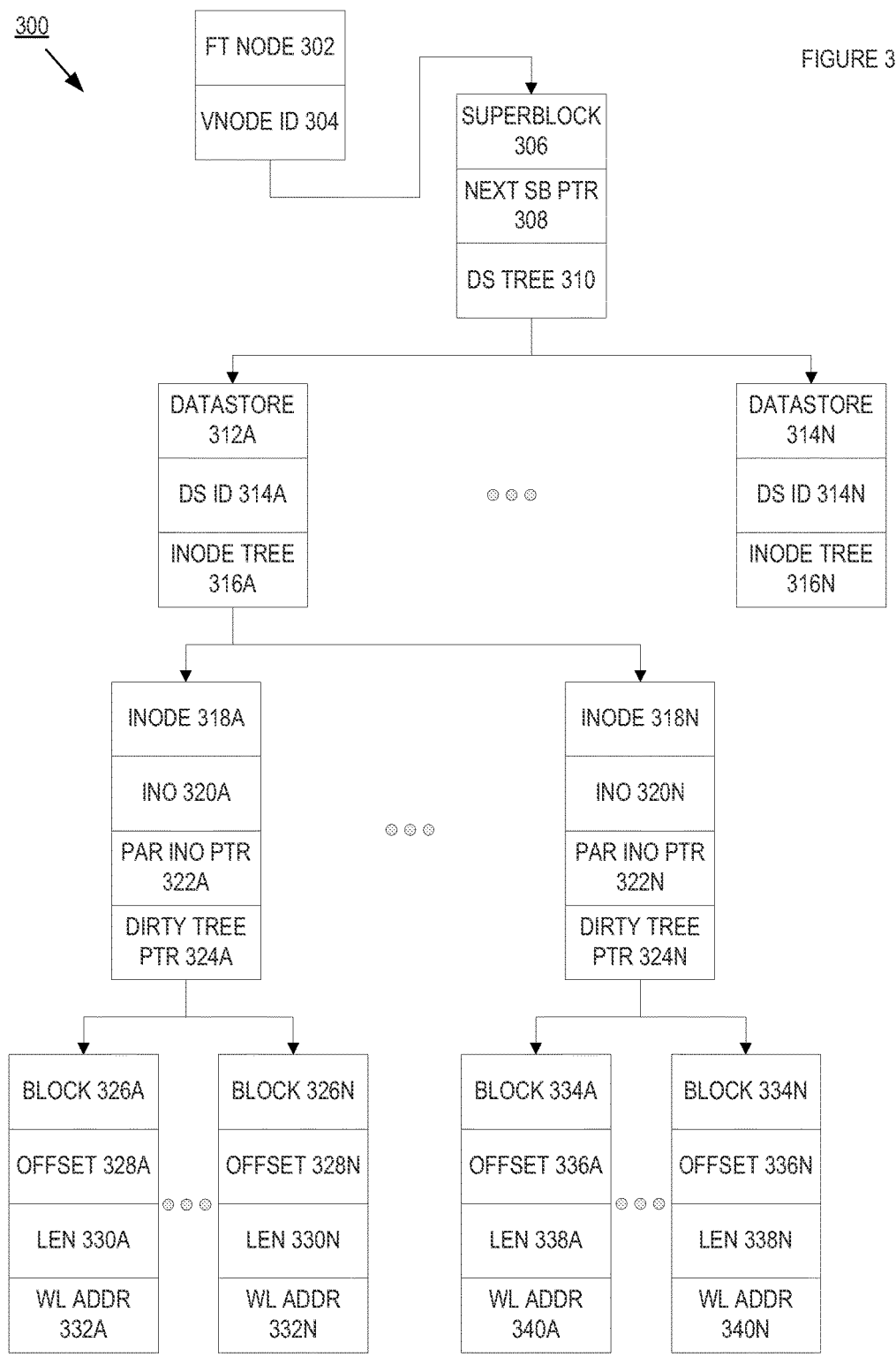
FIG. 3 is a block diagram of one embodiment of a delta tree without a clone.

In one embodiment, an in-memory delta tree captures modifications to the filesystem that gets logged into the write log. FIG. 3 is a block diagram of one embodiment of a delta tree 300 without a clone. In one embodiment, the filetree delta tree 300 includes the filetree vNode 302 and the namespace vNode Identifier 304. In one embodiment, the filetree vNode 302 is a virtual node that is used to hold the filetree metadata. In one embodiment, the filetree vNode identifier 304 is the identifier for this filetree virtual node.

The filetree vNode identifier 304 a superblock 306. In one embodiment, there is one superblock for the filetree virtual node 302. In alternative embodiments, there is more than one superblock 306 for that filetree virtual node 302. In one embodiment, the superblock 306 includes a next superblock pointer 308 and datastore tree 310. In one embodiment, the next superblock pointer 308 is a pointer to the next superblock in the filetree delta tree 300.

In one embodiment of datastore tree 310 is a tree of one or more individual datastores 310A-N for the superblock 306. For example in one embodiment, the datastore tree 308 references to several separate instances of datastores, 310A-N. In one embodiment, each of the individual datastores 310A-N includes a datastore identifier 314A-N and inode tree 316A-N. Each inode tree 316A-N points to the directory of one or more inode(s) 318A-N. In one embodiment, the inode 318A is a data structure used to represent stored data, such as the attributes and/or disk block locations of the data. In one embodiment, each inode 318A-N includes an inode identifier 320A-N, parent inode pointer 322A-N, and the dirty tree pointer 324A-N. In one embodiment, the inode identifier 320A-N identifies the respective inode 320A-N. In one embodiment, the parent inode pointer 322A-N references the parent inode for this inode 320A-N. In one embodiment, the dirty tree pointer 324A-N is a pointer the dirty tree for this inode 318A-N.

In one embodiment, each dirty tree pointer 324A-N points set of one or more blocks 326A-N or blocks 334A-N. In one embodiment, each block 326A-N (or 334A-N) represents a range of data within an object that was written. In one embodiment, each block 324A-N (or 334A-N) includes an offset 328A-N (or 336A-N), length 330A-N (338A-N), and write log address 332A-N (or 340A-N). In one embodiment, the offset 328A-N (or 336A-N) is the starting offset of the block that was written. In one embodiment, the length 330A-N (338A-N) is the length of the respective block. In one embodiment, the write log address 332A-N (or 340A-N) is the write log address that corresponds to this block.

Figure 4:
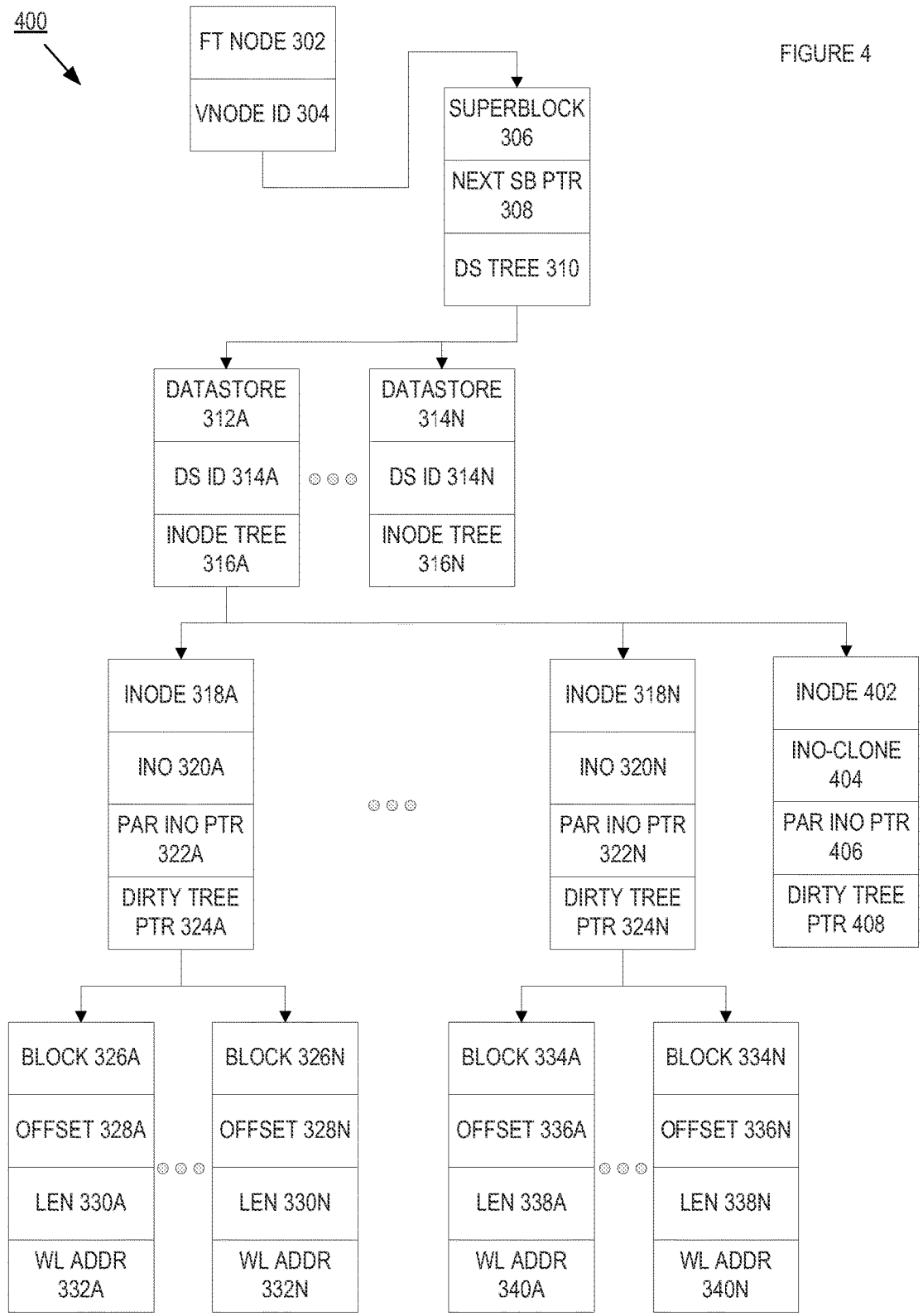
FIG. 4 is a block diagram of one embodiment of a delta tree with a clone.

After the snapshot is created on each of the filetree vNodes, the delta tree would look like the one in FIG. 4, where inode 318N is the source inode and inode 318C is the cloned inode. FIG. 4 is a block diagram of one embodiment of a delta tree 400 with a clone. In one embodiment, the filetree delta tree 400 has the same or similar structure as the filetree delta tree 300 with the addition of a clone inode 402. In one embodiment, the filetree delta tree 400 includes a filetree vNode 302 that, in turn, includes a vNode identifier 304 referencing a superblock 306. The superblock 308 includes a next superblock pointer 308, and datastore tree 310. The datastore tree 310 references a plurality of datastores 312A-N, where each datastore includes a datastore identifier 314A-N and inode tree 316A-N. Each inode tree 316A-N references a plurality of inodes 318A-N and a clone inode 402. Each of the inodes 318A-N includes an inode identifier 320A-N, parent inode pointer 322A-N, and the dirty tree pointer 324A-N. Each of the dirty tree pointers points to a block 326A-N as described above.

In one embodiment, the clone inode 402 has the same or similar structure as an inode 318A-N in the delta tree 400. In one embodiment, the clone inode 402 can be used for creating a snapshot or clone. In one embodiment, the clone inode 402 includes the clone inode identifier 404, parent inode pointer 406, and dirty tree pointer 408. In one embodiment, the clone inode identifier 404 identifies the respective clone inode 402. In one embodiment, the parent inode pointer 406 references the parent inode for this inode 402. In one embodiment, the dirty tree pointer 408 is a pointer the dirty tree for this clone inode 402. In this embodiment, the clone inode's dirty tree pointer is null, which mean that there are a no dirty blocks referenced by the dirty tree.

After a clone operation, both the snapshot and cloned inode are marked as read only. In one embodiment, a clone operation can be used to create a snapshot, including a clone. Any update operation on them (e.g., write, set attribute, delete) will involve creating an in-memory delta-delta tree as mentioned in FIG. 5 below. In one embodiment, creating in-memory delta-delta tree checkpoints the source inode so that there is no need to perform a premature write log sync to disk. In this embodiment, the specific portion of the delta tree involving that source inode is checkpointed, which is an in-memory operation. In this embodiment, nothing else in the system is affected. At the regular write log sync interval the whole in-memory delta-delta tree can be merged and flushed to the disk, which saves the system from overwriting the same data twice.

Figure 5:
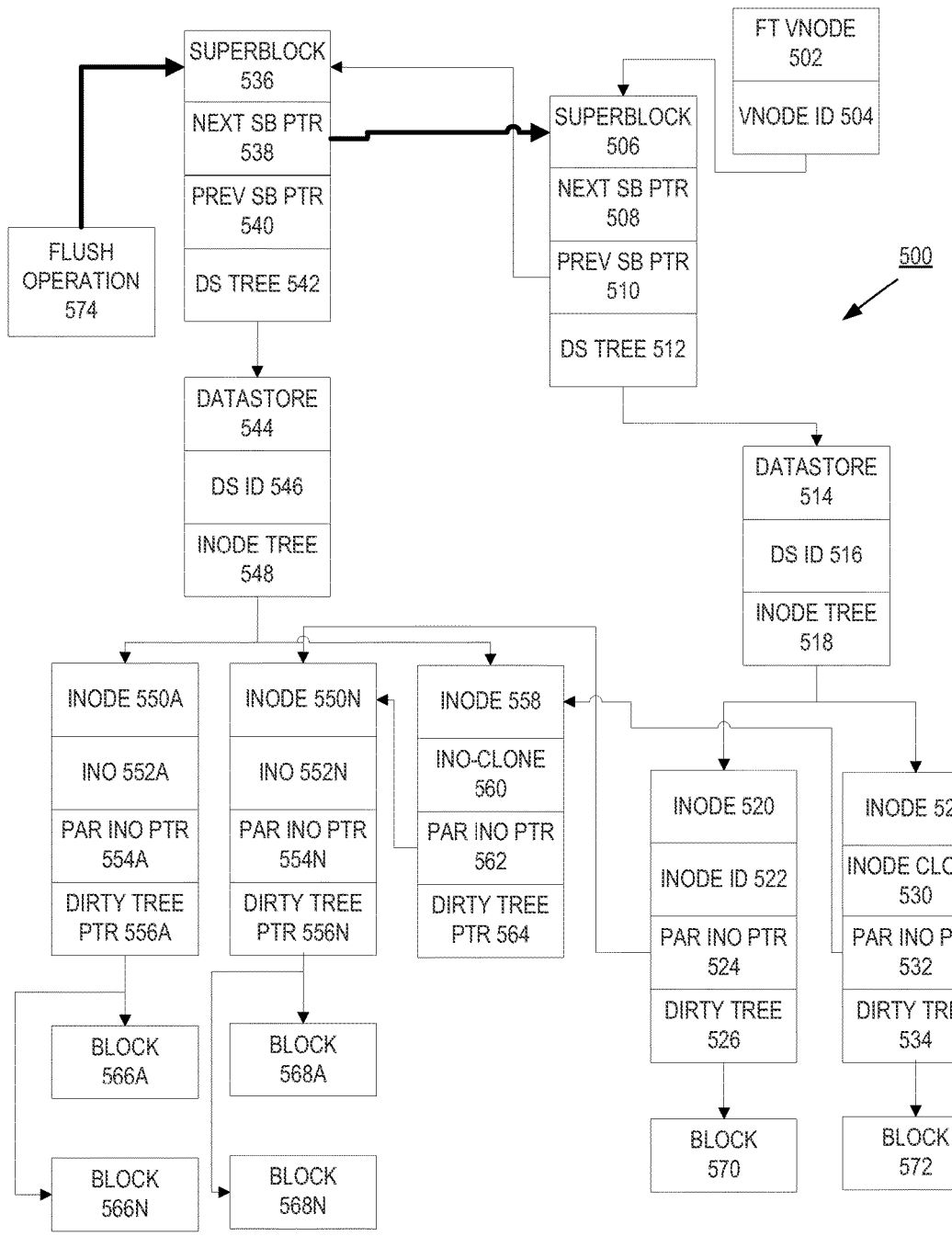
FIG. 5 is a block diagram of one embodiment of a delta-delta tree on an update.

In one embodiment, a delta-delta tree captures the modifications to the current delta tree since the time the snapshot was taken. FIG. 5 is a block diagram of one embodiment of a delta-delta tree 500 on an update. In one embodiment, the delta-delta tree 500 includes a filetree vNode 502 that includes a vNode identifier 504. In this embodiment, the filetree vNodes include two superblocks 506 and 536 that have references to each other in the components of these superblocks. In one embodiment, each of the superblocks 506 and 536 represent parts of a delta tree that have cross-references to each other.

In one embodiment, superblock 506 has a similar structure to the superblocks described above in FIGS. 3 and 4. In this embodiment, superblock 506 includes a next superblock pointer 508, previous superblock 510, and datastore tree 512. The datastore tree 512 references the datastore 514, where the datastore 514 includes a datastore identifier 516 and inode tree 518. The inode tree 518 references an inode 520 and a clone inode 402. The inode 520 includes an inode identifier 522, parent inode pointer 524, and the dirty tree pointer 524A-N. Each of the dirty tree pointers points to a block 526A-N similar as described above in FIGS. 3 and 4. The dirty tree 526 points to one or more blocks 570 similar as described above in FIGS. 3 and 4. In addition, in this embodiment, the inode tree 518 references the clone inode 528. The clone inode 528 includes the clone inode identifier 530, parent inode pointer 532, dirty tree 534, where the dirty tree 534 points to one or more blocks 572.

Similarly, and in one embodiment, superblock 536 has a similar structure to the superblocks as described in FIGS. 3 and 4 above. In this embodiment, superblock 536 includes a next superblock pointer 538, previous superblock 540, and datastore tree 542. The datastore tree 542 references a datastore 544, where each datastore includes a datastore identifier 546 and inode tree 548. The inode tree 548 references a plurality of inodes 550A-N and a clone inode 558. Each of the inodes 550A-N includes an inode identifier 552A-N, parent inode pointer 554A-N, and the dirty tree pointer 556A-N. In addition, in this embodiment, the inode tree 548 references the clone inode 558. The clone inode 558 includes the clone inode identifier 560, parent inode pointer 562, dirty tree 564, where the dirty tree 534 points may point to one or more blocks. In this embodiment, the dirty tree 564 does not reference any blocks at this point.

As described above, each of the superblocks 506 and 536 includes references to parts of the corresponding superblock. In one embodiment, the previous superblock pointer 510 of superblock 506 points to superblock 536. Correspondingly, the next superblock pointer 538 of superblock 536 points to superblock 506. In addition, the delta-delta tree 500 includes references between the two groups of inodes. In one embodiment, the parent inode pointer 524 of inode 520 points to inode 550N. The parent inode pointer points to the parent inode in the delta-delta tree. It is set to NULL for the base inode. In addition, the parent inode pointer 524 of clone inode 528 points to clone inode 558. The parent inode pointer 524 is used to traverse the chain of inodes across delta-delta tree to server data for a read request. This is further described in Flowchart 1000.

In one embodiment, once a write log is full, a flushing operation can flush a delta-delta tree. The StorFS system can flush each delta tree of the delta-delta tree starting from the oldest super block and everything under it to the newest super block. For example and in one embodiment, a flushing operation 572 flushes the delta tree under superblock 536 and proceeds to flush the next superblock 506.

In one embodiment, a creation of snapshot involves logging an entry onto the write log across the different stripes (e.g., filetree vNodes) of the source object and the namespace vNode and updating the in-memory delta tree on them. In one embodiment, the logging and in-memory updates across the stripes is done is an asynchronous operation. In one embodiment, the logging and in-memory updates can be done in parallel. Creation of a snapshot is further described in FIG. 6AB below.

Once the clone request is received on the namespace node, this node reserves the inode number by writing inode number to the write log so that same number cannot be reused after a crash. A clone request can be used to create a snapshot, including a clone. Once that is done, the clone request for each stripe is forwarded to the filetree vNodes that creates the in-memory inode for that the clone. The filetree vNode marks the source inode as the parent and logs the source inode onto the SSD. On completion, the filetree vNode populates the in-memory tree with the clone inode.

Figure 6A:
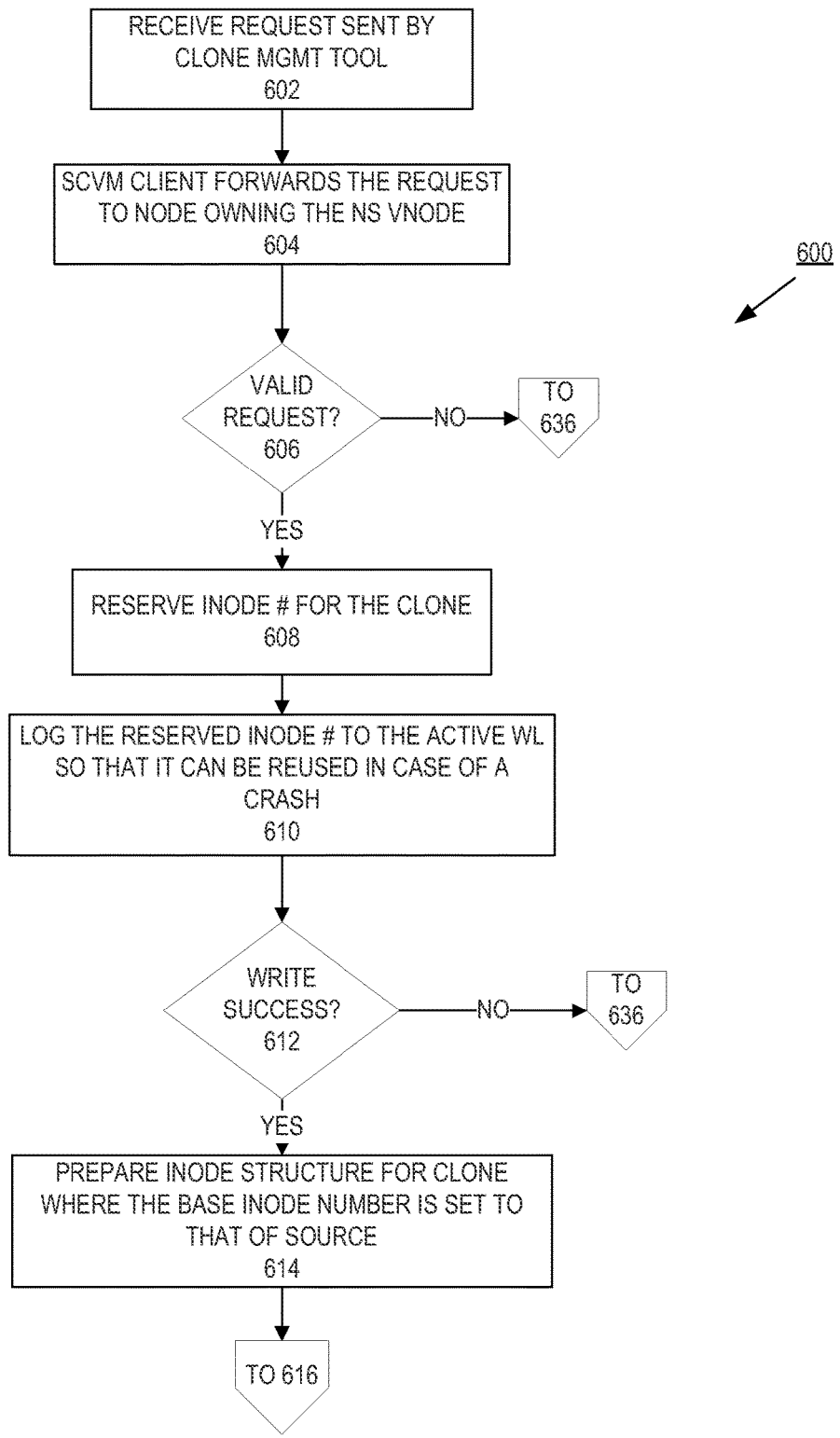
FIGS. 6A-B are flow diagrams of one embodiment of a process to handle a clone creation request.
Figure 6B:
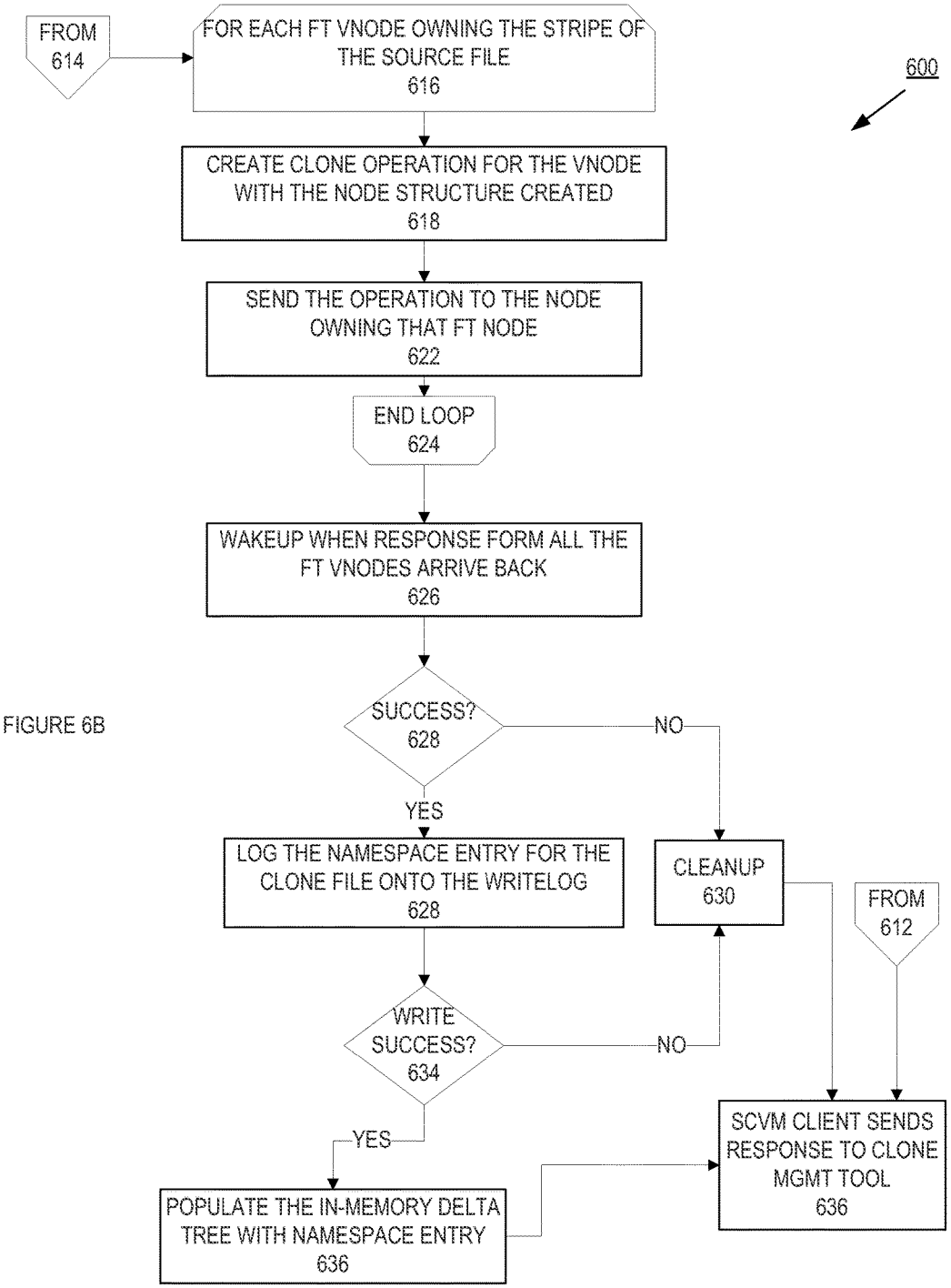

FIGS. 6A-B are flow diagrams of one embodiment of a process 600 to handle a clone creation request. In one embodiment, the data services layer 212 of FIG. 2 performs process 600. In FIG. 6, process 600 begins by receiving a request sent by the clone management tool at block 602. At block 604, the SCVM client forwards the request to the node owning this namespace vNode. In one embodiment, the SCVM is the SC client 108A-C as described above in Figure. Process 600 determines if this is a valid request a block 606. In addition, at block 606, process 600 determine which the set of vNodes that have stripes for the source object included in the received request. If the request is not a valid request, execution proceeds to block 636 below. If the request is valid, at block 608, process 600 reserve an inode number for the clone. In one embodiment, by reserving the inode number for the clone, process 600 allocates an inode for the snapshot that can be used to store the data for the clone. At block 610, process 600 logs the reserved inode to the active write log so that this inode number can be reused in case of a crash.

At block 612, process 600 determines if the write was a success. If the write was not a success, execution proceeds to block 612 below. If the write is a success at block 614, process 600 prepares the inode structure for the snapshot with a base inode number set to that of the source. Execution of process 600 continues in FIG. 6B below.

In FIG. 6B, processed 600 continues by performing a processing loop (blocks 616 through 624) for each filetree vNode owning the stripe of the source object. At block 618, process 600 creates a clone operation for the vNode with the node structure created. Process 600 sends this operation to the node owning that filetree vNode. In one embodiment, the filetree vNode will receive the create operation and perform the filetree clone operation for the vNode as described in FIG. 7AB below. The processing loop ends at block 624. At block 626, process 600 wakes up when responses from all the filetree vNodes arrive back. In one embodiment, by sending out the clone operations to the various filetree vNodes, the cloning can be done concurrently. In this embodiment, each of the individual clone operations on the filetree vNodes may end at different times. To handle this, process 600 waits for the responses from all the filetree vNodes to arrive back before proceeding.

At block 628, process 600 determines if the responses from the filetree vNodes indicate success. If the responses or a subset of the responses indicates that it is not a success, execution proceeds to block 630 below. If success is indicated, at block 628, process 600 logs the namespace entry for the clone object onto the write log. At block 634, process 600 determines if the write is a success. If the write is a success, at block 636, process 600 populates the in-memory delta tree with that namespace entry. Execution proceeds to block 636 below. If the write is not a success, at block 634, execution proceeds to block 630 below. At block 630, process 600 cleans up. In one embodiment, the cleanup occurs if the clone operation did not complete successfully. Execution proceeds to block 636 below. At block 636, the SCVM client sends a response to the clone management tool. In one embodiment, the response indicates whether the clone operation was a success or not. If the clone operation was a success, process 600 sends a response indicating success. If the clone operation was not successful, process 600 sends a response indicating there or failure.

In one embodiment, once all the filetree vNodes respond, the namespace vNode logs the final namespace entry onto the write log. On completion, the namespace vNode populates the in-memory delta tree on the namespace vNode with the namespace entry for future look up of the clone. Once done, the namespace vNode acknowledges the clone request to the caller. In one embodiment, each entry on the write log on both the namespace vNode and filetree vNodes is mirrored to handle node failures. In one embodiment, the namespace vNode and filetree vNodes is mirrored are mirrored as described in the co-pending application entitled "System and methods of a Hybrid write cache for distributed and scale-out storage appliances," U.S. patent applicant Ser. No. 14/135,494, filed on Dec. 19, 2013. If one more filetree vNodes fail, the namespace vNode will cleanup the inodes on the other filetree vNodes. Until the namespace vNode's in-memory delta tree is not updated, the lookup for the clone object will not succeed and hence will not be accessible even if the inodes have been populated on the filetree vNode. At this point both the snapshot and cloned inode are marked as read only as mentioned in FIG. 4. Any update operation on them (e.g., write, set attribute, or delete) will involve creating an in-memory delta-delta tree as mentioned in FIG. 5.

Figure 7A:
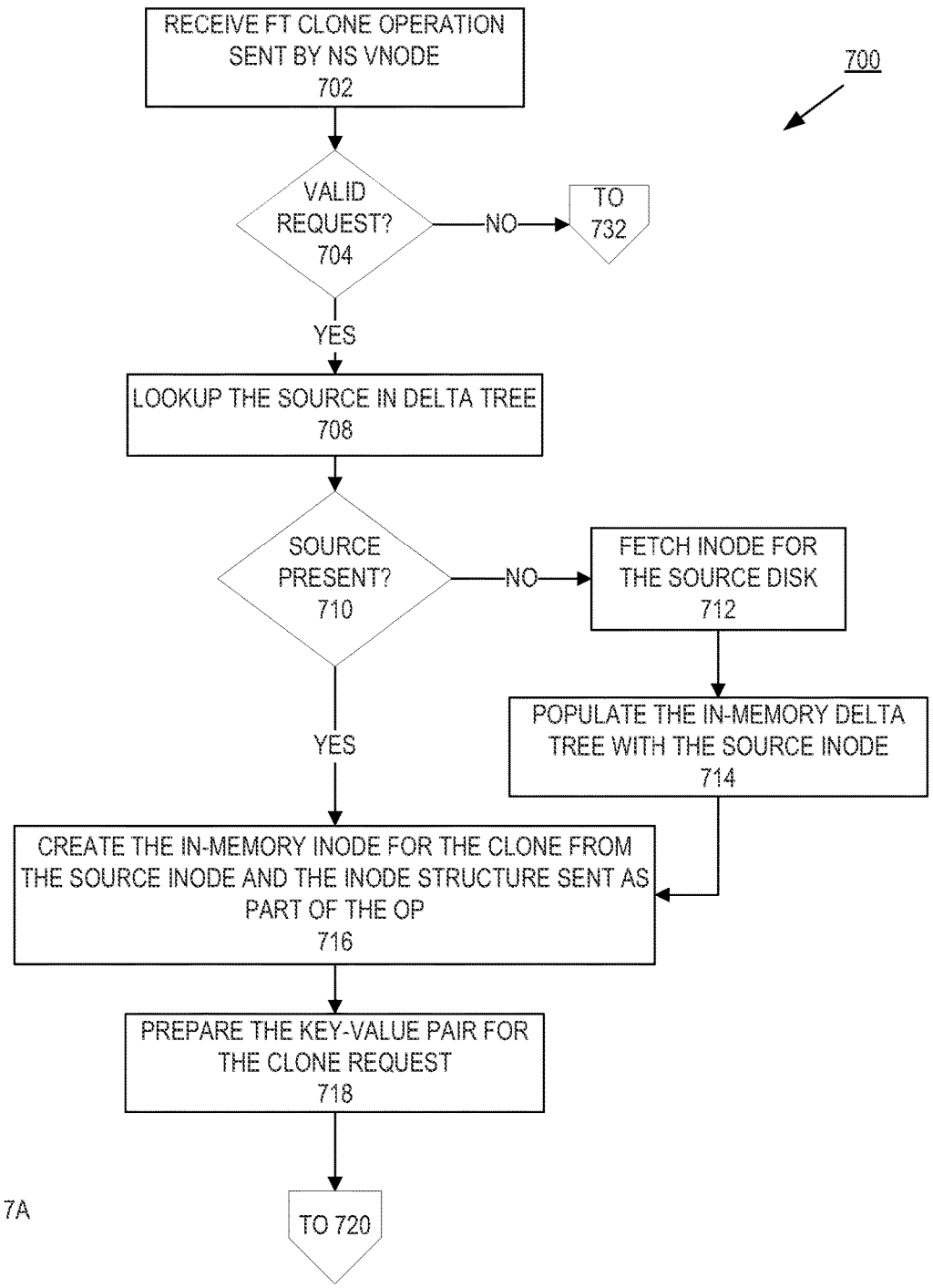
FIGS. 7A-B are flow diagrams of one embodiment of a process to handle a filetree vNode clone creation request.
Figure 7B:
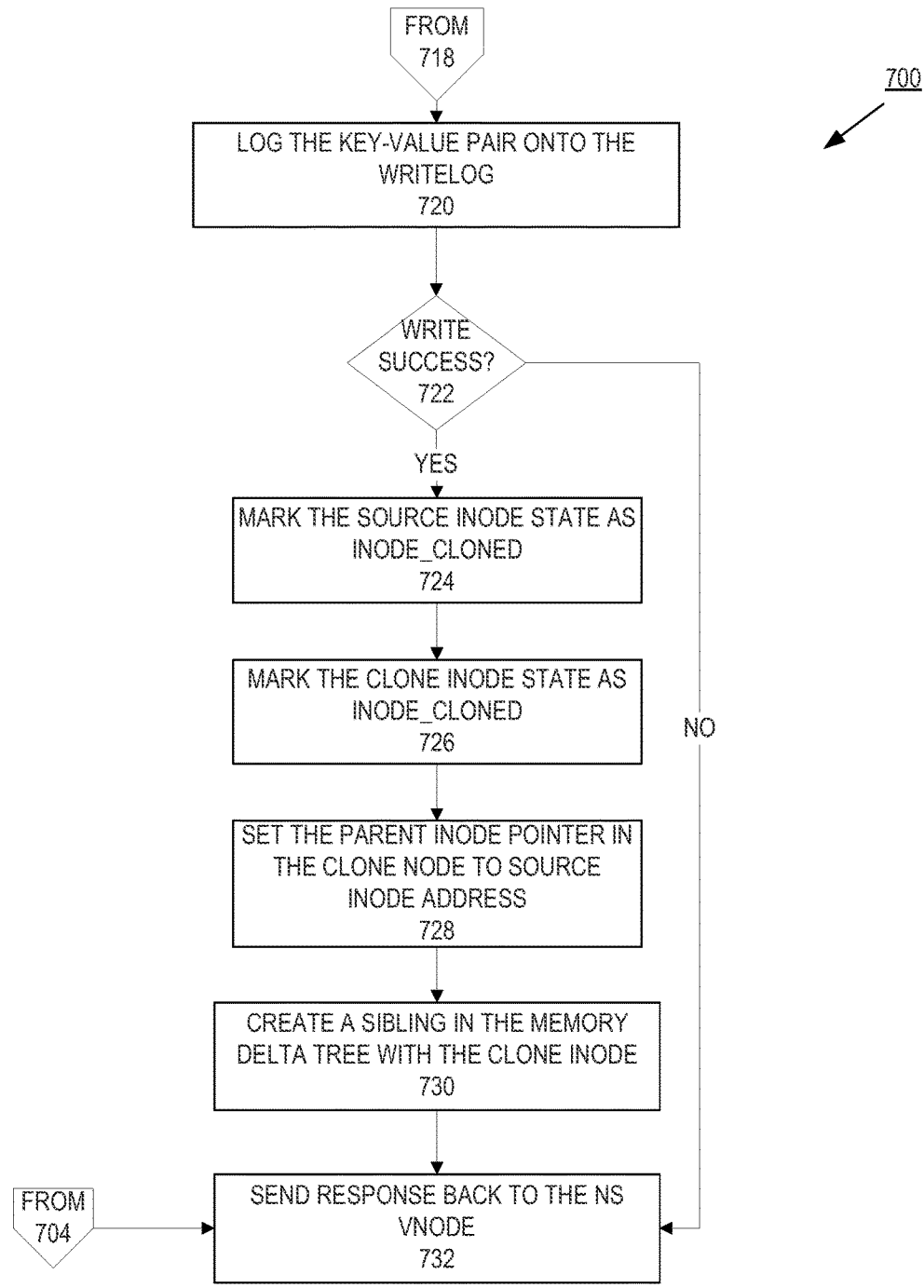

FIGS. 7A-B are flow diagrams of one embodiment of a process 700 to handle a filetree vNode clone creation request. In one embodiment, the data services layer 212 of FIG. 2 performs process 700. In FIG. 7A, process 700 begins by receiving a filetree clone operation sent by namespace vNode at block 702. At block 704, process 700 determines if the received request is valid. If the request is not valid, execution proceeds to block 732 below. If this is a valid request, process 700 looks up the source inode in the delta tree at block 708. At block 710, process 700 determines if the source is present in the delta tree. If the source is not present, at block 712, process 700 fetches an inode for the source disk. At block 714, process 700 populates the in-memory delta tree with this source inode.

If the source inode is present, in the delta tree, at block 716, process 700 creates the in-memory inode for the snapshot from the source inode and inode structure sent as part of the received clone operation. In one embodiment, the created inode is the clone inode 402 as described above in FIG. 4. At block 718, process 700 prepares the key-value pair for the clone request. In one embodiment, the key-value pair where the key uniquely identifies the clone inode and value is the clone inode itself. Execution of process 700 continues in FIG. 7B below.

In FIG. 7B, process 700 continues by logging the key value pair onto the write log at block 720. At block 722, process 700 determines if the write was a success. If the write was not a success, execution proceeds to block 732 below. If the write was success, process 700 marks the source inode state as inode cloned at block 724. At block 726, process 700 marks the clone inode state as inode cloned. Process 700 sets the parent item pointer in the clone inode to the source inode address at block 728. Process 700 creates a sibling in the memory delta tree with a clone inode at block 730. In one embodiment, the sibling is the clone inode structure 402 as described in block 402 above. at block 732, process 700 sends a response back to the namespace vNode at block 732. In one embodiment, the response indicates whether the clone operation was a success or not.

In one embodiment, snapshot deletion is a straightforward operation and is the same as the regular file deletion. For example and in one embodiment, files are deleted as described in as described in the co-pending application entitled "System and methods of a Hybrid write cache for distributed and scale-out storage appliances," U.S. patent applicant Ser. No. 14/135,494, filed on Dec. 19, 2013. In one embodiment, a difference between snapshot and file deletion is that if deletion is issued on the snapshot or cloned inode in the delta tree for which the delta-delta tree is not created on the filetree vNode. If this is a cloned inode (source), the StorFS system creates the a-inode in the delta-delta tree and marks the inode state as deleted. If the deletion is for the clone inode, the StorFS system de-allocates the inode since the inode has not yet been flushed to disk. But for the later one if the delta-delta tree is created, then the state needs to be marked as deleted.

Figure 8:
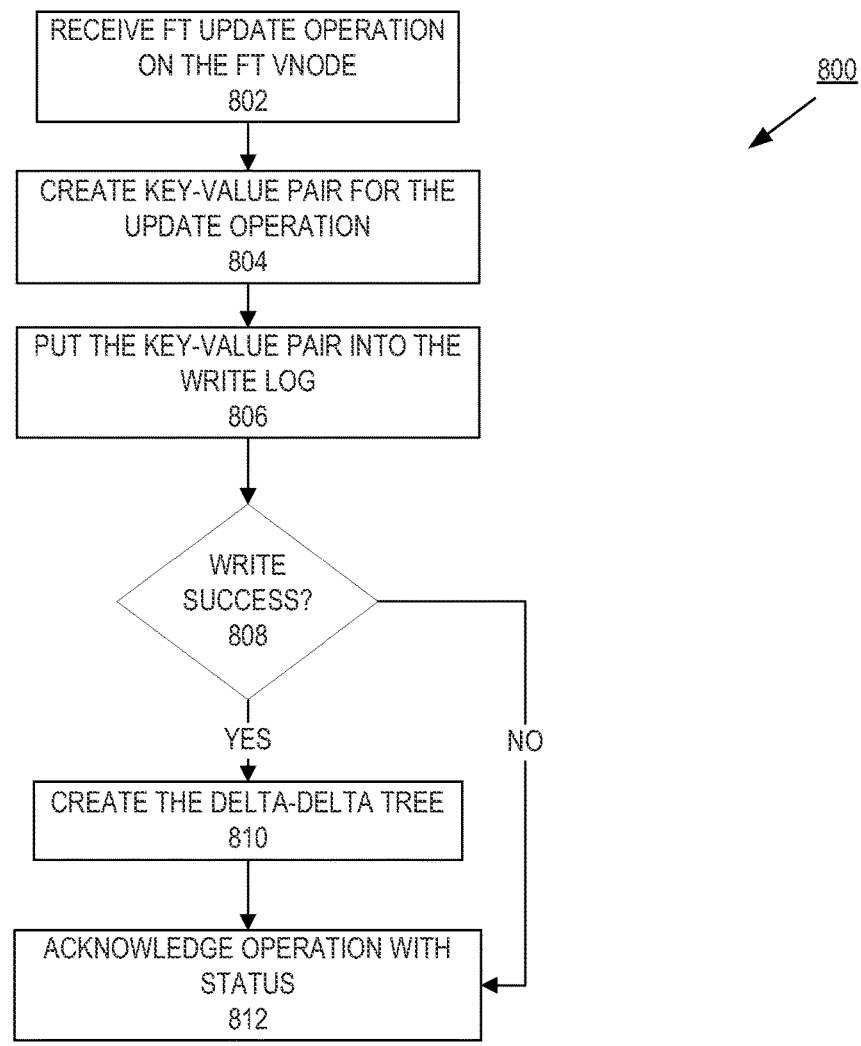
FIG. 8 is a flow diagram of one embodiment of a process to handle an update operation.

FIG. 8 is a flow diagram of one embodiment of a process 800 to handle an update operation. In one embodiment, the data services layer 212 of FIG. 2 performs process 800. In FIG. 8, process 800 begins by receiving the filetree update operation on the filetree vNode at block 802. At block 804, process 800 creates the key-value pair for the update operation. Process 800 puts the key-value pair into the write log at block 806. At block 808, process 800 determines if the write was a success. If the write was not a success, execution proceeds to block 812 below. If the write was a success, process 800 creates the delta-delta tree at block 810. At block 812, process 800 acknowledges the operation with the status. In one embodiment, the status indicates success or failure.

In one embodiment, each filetree vNode hosts a particular stripe of a file. In this embodiment, a SCVM client sends the read request to the correct stripe. In one embodiment, the SCVM client sends the read request using the deterministic formula as described above. In one embodiment, the delta-delta tree can be present for active and passive write log as described in the co-pending application entitled "System and methods of a Hybrid write cache for distributed and scale-out storage appliances," U.S. patent applicant Ser. No. 14/135,494, filed on Dec. 19, 2013.

In one embodiment, for every read operation, the StorFS system looks up the latest inode in the delta-delta tree. If present, the StorFS system will serve the read from a contiguous range data from the active write log group. If not, the StorFS system serves the read using similar steps on the passive delta-delta tree until the next offset that can be served from the active delta-delta tree. In one embodiment, if the read cannot be served from the active delta-delta tree, the read is served from the passive delta-delta using reads that are issued to the STFS layer on-disk. In this embodiment, these same steps are repeated until the read is completely served or an end-of-file has been reached. In one embodiment, the above operations are in-memory lookups. In addition, for each conflict, the StorFS system finds in the delta-delta tree the list of key-value gets that are top be performed. In one embodiment and in a single shot, the StorFS system performs a KV_batch get for active/passive delta-delta tree and STFS layer in order to take advantage of any coalescing of reads from the disk that be done underlying device layer.

Figure 9A:
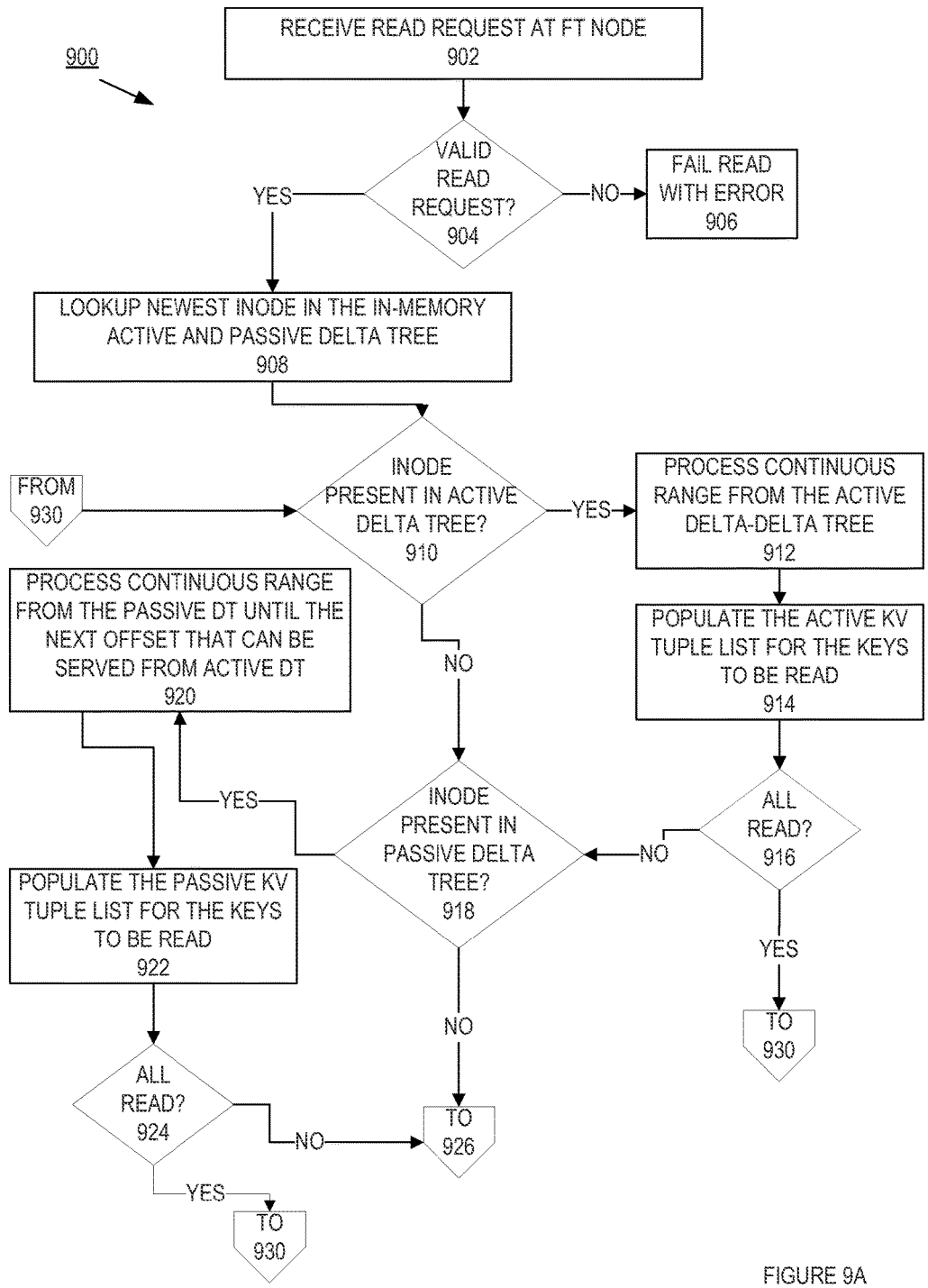
FIGS. 9A-B are flow diagrams of one embodiment of a process to read data with a clone.
Figure 9B:
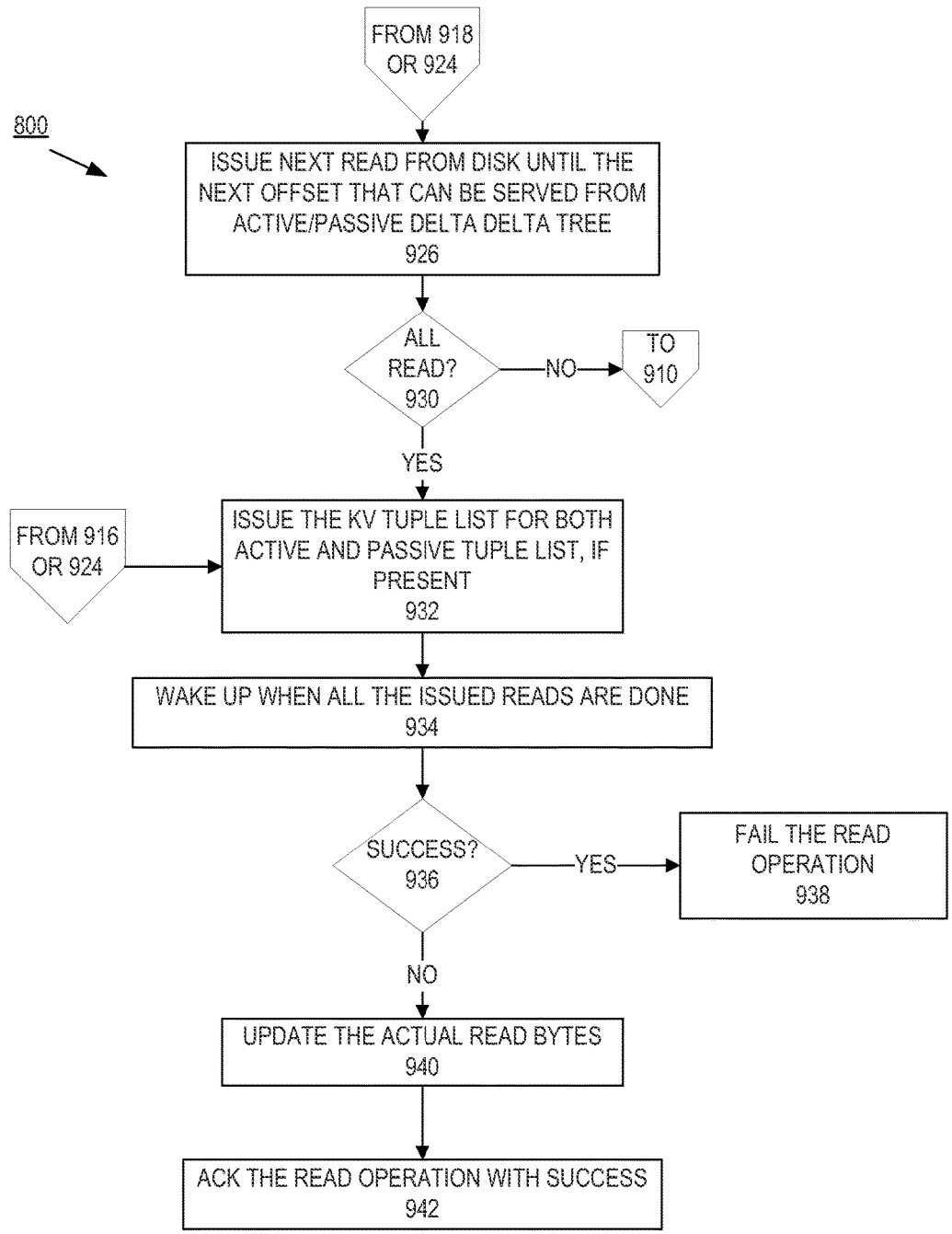

FIGS. 9A-B are flow diagrams of one embodiment of a process 900 to read data with a clone. In one embodiment, the data services layer 212 of FIG. 2 performs process 900. In FIG. 9A, process 900 begins by receiving a read request at the filetree node. At block 904, process 900 determines if the read request was valid. If the read request is not valid, process 900 fails the read with an error at block 906. If the request was valid, at block 908, process 900 looks up the newest inode in the in-memory active and passive delta tree. At block 910, process 900 determines if the inode is present in the active delta tree. If the inode is present, process 900 processes a continuous range from the active delta-delta tree at block 912. In one embodiment, processing the continuous range from the active delta-delta tree is further described in FIG. 10 below. At block 914, process 900 populates the active KV_tuple list for the keys to be read. At block 916, process 900 determines if all the data has been read. If all the data has been read, execution proceeds to block 930 below. If there is still more data to be read, execution proceeds to block 918 below.

At block 918, process 100 determines if there is an inode present in the passive delta tree. If there is not an inode present in the passive inode delta tree, execution proceeds to block 926 below. If there is an inode present in the passive delta tree, process 900 processes a continuous range from the passive delta tree until the next offset that can be served from the active delta tree at block 920. At block 922, process 900 populates the passive KV_Tuple list for the keys to be read. Process 900 determines if all the data has been read at block 924. If there is more data to be read, execution proceeds to block 926 below. If all the data has been read, execution proceeds to block 930 below. Execution of process 900 continues in FIG. 9B below.

In FIG. 9B, process 900 continues by issuing the next read from the disk until the next offset that can be served from the active/passive delta-delta tree at block 926. At block 930, process 900 determines if all the data has been read. If there is more data to be read, execution proceeds to block 910 above. If all the data has been read, process 900 issues the KV_tuple list for both the active and passive list, if present. At block 934, process 900 wakes up when the read operations are done. Process 900 determines if the issued reads were a success at block 936. If the reads were a success, process 900 fails the read operation at block 938. In one embodiment, process 900 fails the read operation if there one, some, or all the read operations were not successful. If the read operation were success, at block 940, process 900 updates the actual bytes that are read. Process 900 acknowledges the read operation with the success at blocked 942. In one embodiment, process 900 acknowledges the read operation was successful read operation by sending a response back to the requesting client indicating success.

Figure 10:
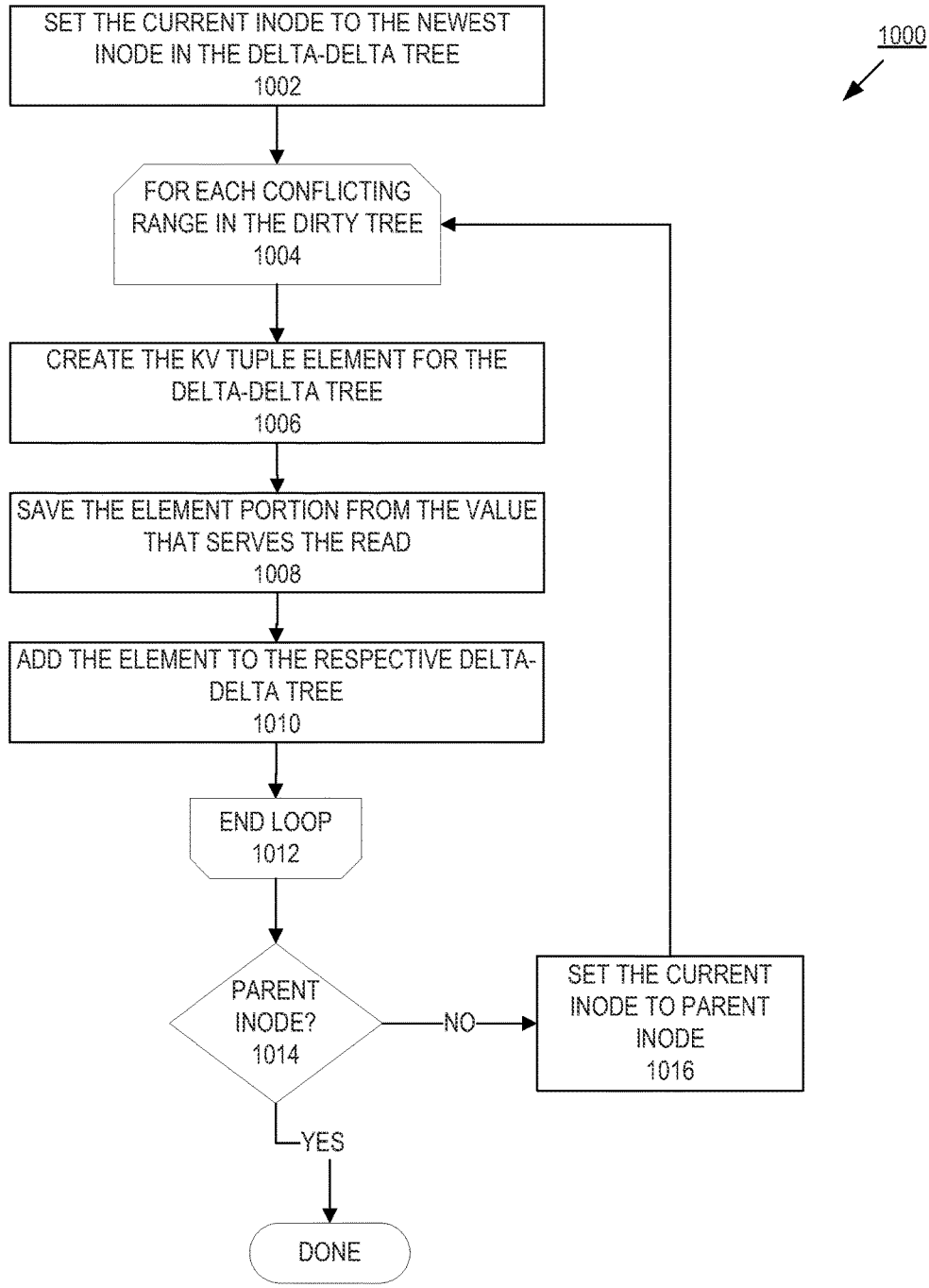
FIG. 10 is a flow diagram of one embodiment of a process to serve a contiguous range from a given delta-delta tree.

FIG. 10 is a flow diagram of one embodiment of a process 1000 to serve a contiguous range from a given delta-delta tree. In one embodiment, the write cache 208 as described in FIG. 2 performs process 1000. In FIG. 10, process 1000 begins by setting the current inode to the newest inode the delta-delta tree. Process 900 performs a processing loop (blocks 1004-1012) for each conflicting range in the dirty tree. At block 1006, process 900 creates the KV_Tuple element for the delta-delta tree. Process 1000 saves the element portion from the value that serves the read at block 1008. At block 1010, process 1000 adds the element to the respective delta-delta tree. The processing loop ends at block 1012. At block 1014, process 1000 determines if the current inode has a parent inode. If the current inode does not have the parent inode, at block 1016, process 1000 sets the current inode to the parent inode. Execution proceeds to block 1004 above. If the current inode is the parent inode, process 1000 completes execution.

In one embodiment, once a write log is full, a flushing operation can flush a delta-delta tree. The StorFS system can flush each delta tree of the delta-delta tree starting from the oldest super block and everything under it to the newest super block as indicated in FIG. 5. If the inode is to be flushed is a clone, the StorFS system copies the topmost inode structure, updates the unique info and writes it, and updates the inode table with its address. In this embodiment, any future writes to the snapshot will just be regular writes since as usual. In one embodiment, there is no copy on write involved. Because the StorFS system uses a fingerprint based file system for data deduplication, the blocks are not modified and will be shared. When a block is unused, the StorFS system runs garbage collector to clean them up. For example and in one embodiment, the StorFS performs garbage collection as described in the co-pending application entitled "System and methods for removing obsolete data in a distributed system of hybrid storage and compute nodes," U.S. patent applicant Ser. No. 14/135,499, filed on Dec. 19, 2013. In addition, while flushing for each snapshot, the unique bytes used by each one of them is maintained, which helps the administrator make space related decisions.

Figure 11:
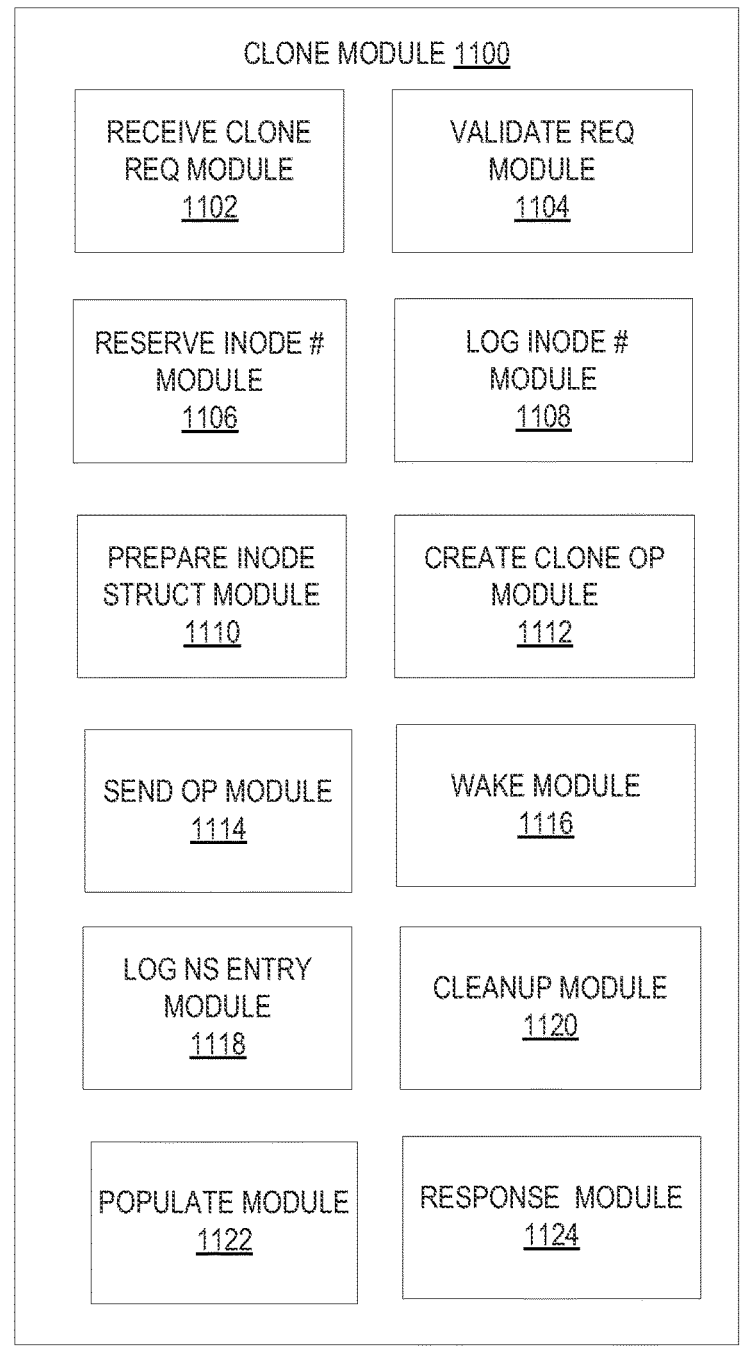
FIG. 11 is a block diagram of one embodiment of a clone module that handles a clone creation request.

FIG. 11 is a block diagram of one embodiment of a clone module 1100 that handles a clone creation request. In one embodiment, the data services layer 212 includes the clone module 1300. In one embodiment, the process create operation module 600 includes a receive clone request model 602, validate request module 604, the reserve inode number module 606, log inode number module 608, prepare inode struct module 610, create clone operation module 612, send operation module 614, wake module 616, logging namespace entry module 618, cleanup module 620, populate module 622, and response module 624. In one embodiment, the receive clone request model 602 receives a create clone request as described above in FIG. 6A, block 602. The validate request module 604 validates a request as described above in FIG. 6A, block 604. The reserve inode number module 606 reserves an inode number as described above in FIG. 6A, block 608. The log inode number module 608 locks the reserved inode number as described above in FIG. 6A, block 610 about. The prepare inode struct module 610 prepares an inode structure as described above in FIG. 6A, block 614. The create clone operation module 616 creates a create clone operation as described above in FIG. 6B, Block 620. The send operation module 614 sends the operation to the node as described above in FIG. 6B, block 622. The logging namespace entry module 618 logs the namespace entry as described above in FIG. 6B, block 628. The cleanup module 620 cleans up as described above in FIG. 6B, block 630. The populate module 622 populates the memory delta tree as described above in FIG. 6B, block 636. The response module 624 sends a response to the client as described above in FIG. 6B, block 638. The wake module 616 wakes up when the responses are arrive back as described above in FIG. 6B, block 626.

Figure 12:
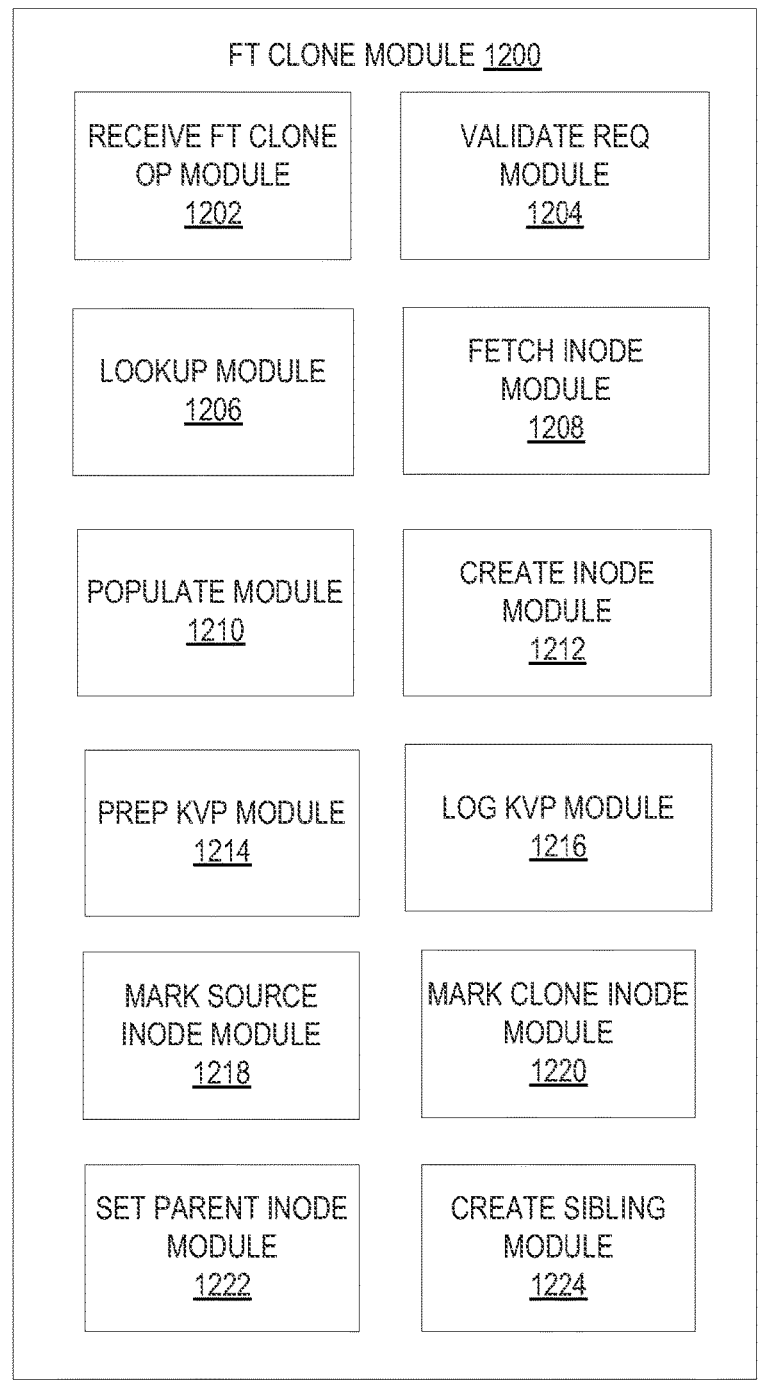
FIG. 12 is a block diagram of one embodiment of a filetree clone module that handles a filetree vNode clone creation request.

FIG. 12 is a block diagram of one embodiment of a filetree clone module 1200 that handles a filetree vNode clone creation request. In one embodiment, the data services layer 212 includes filetree clone module 1200. In one embodiment, the filetree clone module 1200 includes receive filetree clone operation module 1202, validate request module 1204, lookup module 1206, fetch inode module 1208, populate module 1210, create inode module 1212, prepare KVP module 1214, log KVP module 1216, mark source inode module 1218, mark clone inode module 1220, set parent inode module 1222, and create sibling module 1224. In one embodiment, the receive filetree clone operation module 1202 receives the filetree clone operation as described above in FIG. 7A, block 702. The validate request module 1204 validates the request as described above in FIG. 7A, block 704. The lookup module 1206 looks up the source as described above in FIG. 7A, block 708. The fetch inode module 1208 fetches the inode as described above in FIG. 7A, block 712. The populate module 1210 populates the in-memory delta tree as described above in FIG. 7A, block 714. The create inode module 1212 creates the in-memory inode as described above in FIG. 7A, block 716. The prepare KVP module 1214 prepares the key-value pair as described above in FIG. 7A, block 718. The log KVP module 1216 logs the key-value pair as described above in FIG. 7B, block 720. The mark source inode module 1218 marks the source inode as described above in FIG. 7B, block 724. The mark clone inode module 1220 marks the clone inode as described above in FIG. 7B, block 726. The set parent inode module 1222 sets the parent inode as described above in FIG. 7B, block 728. The create sibling module 1224 creates the sibling as described above in FIG. 7B, block 730.

Figure 13:
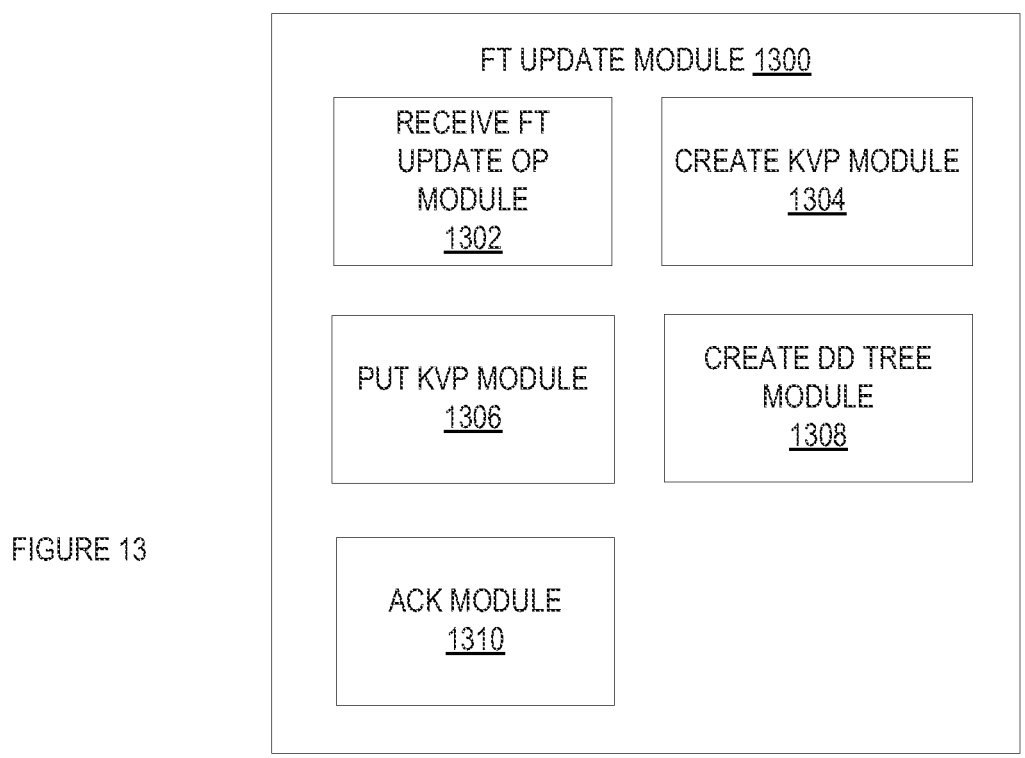
FIG. 13 is a block diagram of one embodiment of a filetree update module that handles an update operation.

FIG. 13 is a block diagram of one embodiment of a filetree update module 1300 that handles an update operation. In one embodiment, the data services layer 212 includes the filetree update module 1300. In one embodiment, the filetree update module 1300 includes receive filetree update operation module 1302, create KVP module 1304, put KVP module 1306, create delta-delta tree 1308, and ack module 1310. In one embodiment, the receive filetree update operation module 1302 receives the filetree update operation as described above in FIG. 8, block 802. The create KVP module 1304 creates the key-value pair as described above in FIG. 8, block 804. The put KVP module 1306 puts the key-value pair as described above in FIG. 8, block 806. The create delta-delta tree 1308 creates the delta-delta tree as described above in FIG. 8, block 810. The ack module 1310 acknowledges the operation as described above in FIG. 8, block 812.

Figure 14:
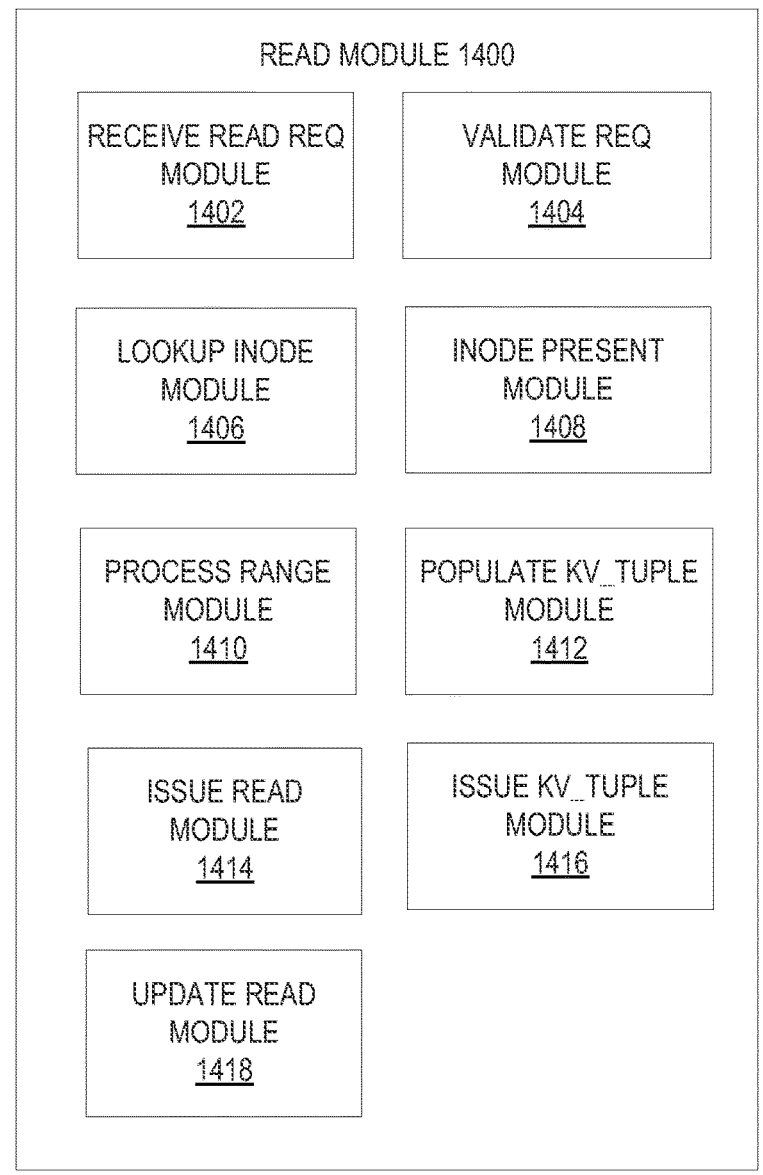
FIG. 14 is a block diagram of one embodiment of a read module that read data with a clone.

FIG. 14 is a block diagram of one embodiment of a read module 1400 that reads data with a clone. In one embodiment, the data services layer 212 of FIG. 2 performs process 1200. In one embodiment, the read module 1400 includes receive read request module 1402, validate request module 1404, lookup inode module 1406, inode present module 1408, process range module 1410, populate KV_Tuple 1412, issue read module 1414, issue KV_Tuple 1416, and update read module 1418. In one embodiment, the receive read request module 1402 receives the read request as described above in FIG. 9A, block 902. The validate request module 1404 validates the request as described above in FIG. 9A, block 904. The lookup inode module 1406 lookup the inode as described above in FIG. 9A, block 908. The inode present module 1408 determines if the inode is present in the active and/or passive trees as described above in FIG. 9A, blocks 910 and 918. The process range module 1410 processes the contiguous range as described above in FIG. 9A, blocks 912 and 920. The populate KV_Tuple 1412 populates the KV_Tuple as described above in FIG. 9A, blocks 914 and 922. The issue read module 1414 issues the next read as described above in FIG. 9B, block 926. The issue KV_Tuple 1416 issues the KV_Tuple list as described above in FIG. 9B, block 932. The update read module 1418 updates the actual bytes read as described above in FIG. 9B, block 940.

Figure 15:
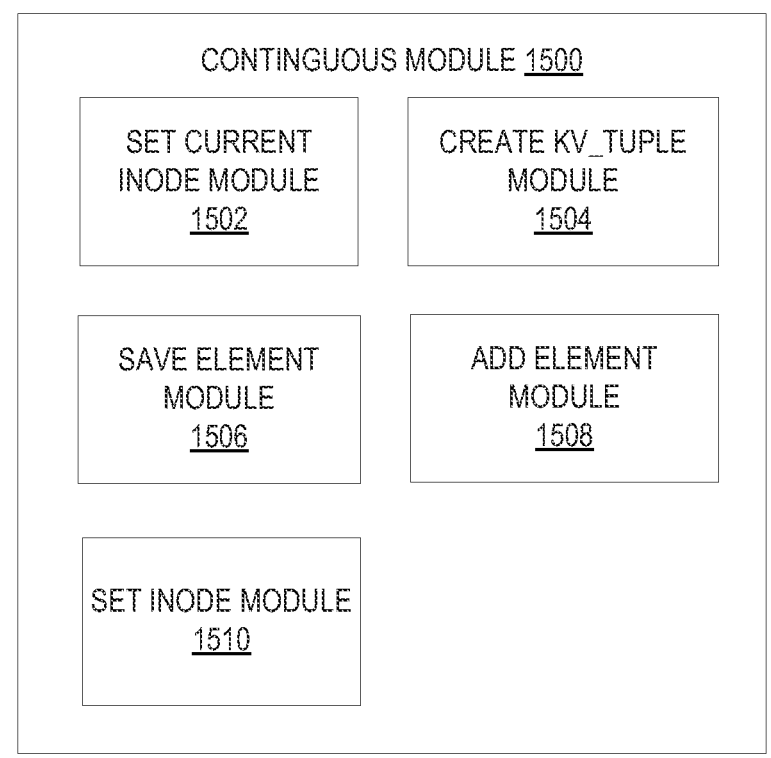
FIG. 15 is a block diagram of one embodiment of a contiguous module that serves a contiguous range from a given delta-delta tree.

FIG. 15 is a block diagram of one embodiment of a contiguous module 1500 that serves a contiguous range from a given delta-delta tree. In one embodiment, the data services layer 212 includes the contiguous module 1400. In one embodiment, the contiguous module 1500 includes a set current inode module 1502, create KV_Tuple module 1504, save element module 1506, add element module 1508, and set inode module 1510. In one embodiment, the set current inode module 1502 sets the current inode as described above in FIG. 10, block 1002. The create KV_Tuple module 1504 creates the KV_Tuple element as described above in FIG. 10, block 1006. The save element module 1506 saves the element as described above in FIG. 10, block 1008. The add element module 1508 adds the element as described above in FIG. 10, block 1010. The set inode module 1510 sets the inode as described above in FIG. 10, block 1016.

Figure 16:
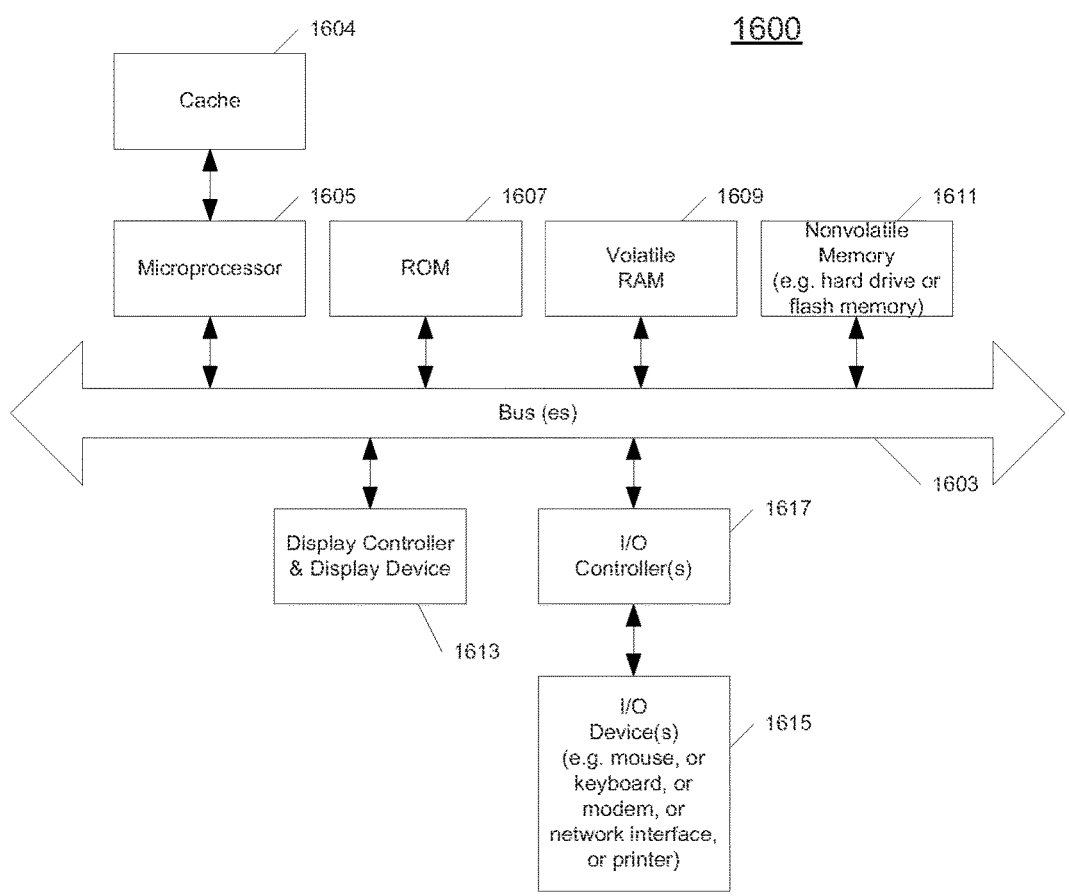
FIG. 16 illustrates one example of a typical computer system, which may be used in conjunction with the embodiments described herein.

FIG. 16 shows one example of a data processing system 1600, which may be used with one embodiment of the present invention. For example, the system 1600 may be implemented including a physical server 102A-C as shown in FIG. 1. Note that while FIG. 16 illustrates various components of a computer system, it is not intended to represent any particular architecture or manner of interconnecting the components as such details are not germane to the present invention. It will also be appreciated that network computers and other data processing systems or other consumer electronic devices, which have fewer components or perhaps more components, may also be used with the present invention.

As shown in FIG. 16, the computer system 1600, which is a form of a data processing system, includes a bus 1603 which is coupled to a microprocessor(s) 1605 and a ROM (Read Only Memory) 1607 and volatile RAM 1609 and a non-volatile memory 1611. The microprocessor 1605 may retrieve the instructions from the memories 1607, 1609, 1611 and execute the instructions to perform operations described above. The bus 1603 interconnects these various components together and also interconnects these components 1605, 1607, 1609, and 1611 to a display controller and display device 1613 and to peripheral devices such as input/output (I/O) devices which may be mice, keyboards, modems, network interfaces, printers and other devices which are well known in the art. Typically, the input/output devices 1615 are coupled to the system through input/output controllers 1617. The volatile RAM (Random Access Memory) 1609 is typically implemented as dynamic RAM (DRAM), which requires power continually in order to refresh or maintain the data in the memory.

The mass storage 1611 is typically a magnetic hard drive or a magnetic optical drive or an optical drive or a DVD RAM or a flash memory or other types of memory systems, which maintain data (e.g. large amounts of data) even after power is removed from the system. Typically, the mass storage 1611 will also be a random access memory although this is not required. While FIG. 16 shows that the mass storage 1611 is a local device coupled directly to the rest of the components in the data processing system, it will be appreciated that the present invention may utilize a non-volatile memory which is remote from the system, such as a network storage device which is coupled to the data processing system through a network interface such as a modem, an Ethernet interface or a wireless network. The bus 1603 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "process virtual machine" (e.g., a Java Virtual Machine), an interpreter, a Common Language Runtime, a high-level language virtual machine, etc.), and/or, electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The present invention also relates to an apparatus for performing the operations described herein. This apparatus may be specially constructed for the required purpose, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), RAMs, EPROMs, EEPROMs, magnetic or optical cards, or any type of media suitable for storing electronic instructions, and each coupled to a computer system bus.

A machine readable medium includes any mechanism for storing or transmitting information in a form readable by a machine (e.g., a computer). For example, a machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)).

The preceding detailed descriptions are presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "transmitting," "creating," "sending," "performing," "generating," "looking," "reading," "writing," "preparing," "updating," "reserving," "logging," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will be evident from the description below. In addition, the present invention is not described with reference to any particular programming language. It will be appreciated that a variety of programming languages may be used to implement the teachings of the invention as described herein.

The foregoing discussion merely describes some exemplary embodiments of the present invention. One skilled in the art will readily recognize from such discussion, the accompanying drawings and the claims that various modifications can be made without departing from the spirit and scope of the invention.

What is claimed is:

1. A non-transitory machine-readable medium having executable instructions to cause one or more processing units to perform a method to create an object snapshot of a source object in a distributed storage system, the method comprising:

receiving a request, on a storage control server to create the object snapshot in the distributed storage system, the distributed storage system including a plurality of virtual nodes and a plurality of physical nodes, the source object includes a plurality of stripes, the plurality of virtual nodes are distributed across the plurality of physical nodes, each physical node owns a set of the virtual nodes, a logical address of the source object references a virtual block address of one of the plurality of virtual nodes, this virtual block address is mapped to a physical block address of one of the plurality of physical nodes, each virtual node in the plurality of virtual nodes is part of a group of a plurality of active mirror virtual nodes that replicate data and metadata of the each virtual node in the plurality of virtual nodes, each of the plurality of virtual nodes is a unit of data routing and management among the plurality of physical nodes, at least one of the plurality of virtual nodes is a metadata virtual node for data stored in an associated cache virtual node;

determining a set of virtual nodes from the plurality of virtual nodes, wherein each virtual node in the set of virtual nodes owns one of the plurality of stripes of the source object and each of the virtual nodes in the set of virtual nodes includes metadata about a modification to the distributed storage system that is logged into a write log of the distributed storage system for that virtual node;

for each virtual node of the set of virtual nodes,
sending a clone request to one of the plurality of physical nodes which owns that virtual node, the clone request is to create a stripe snapshot of a corresponding one of the plurality stripes owned by that virtual node by creating an in-memory clone inode, logging an inode of the corresponding stripe snapshot in the write log, and creating a sibling for the corresponding stripe snapshot in an in-memory delta tree;

wherein the object snapshot includes a set of stripe snapshots.

2. The non-transitory machine-readable medium of claim 1, further comprising:
waking up the storage controller server when responses are received from the set of virtual nodes.

3. The non-transitory machine-readable medium of claim 1, wherein the object snapshot is a read-only copy of the source object at a given point of time.

4. The non-transitory machine-readable medium of claim 1, further comprising:
generating an inode for the object snapshot.

5. The non-transitory machine-readable medium of claim 4, wherein the generating the inode comprises:
reserving an inode number for the inode;
logging the inode number for inode;
preparing an inode structure.

6. The non-transitory machine-readable medium of claim 1, wherein an in-memory delta tree captures modifications to the distributed storage system that are logged in the write log of the distributed storage system for the virtual node.

7. The non-transitory machine-readable medium of claim 1, further comprising:
updating the object snapshot, wherein updating the object snapshot includes,
creating an in-memory delta-delta tree, wherein the delta-delta tree captures modifications to the delta tree since a time the object snapshot was taken.

8. A computerized method that reads data in a distributed storage system, the method comprising:
receiving a request to read the data at one of a plurality of virtual nodes of the distributed storage system, wherein the data is stored in a snapshot, wherein the plurality of virtual nodes are distributed across a plurality of physical nodes of the distributed storage system, each physical node owns a set of the virtual nodes, a logical address of the data references a virtual block address of one of the plurality of virtual nodes, this virtual block address is mapped to a physical block address of one of the plurality of physical nodes, each virtual node in the plurality of virtual nodes is part of a group of a plurality of active mirror virtual nodes that replicate data and metadata of the each virtual node in the plurality of virtual nodes, each of the plurality of virtual nodes is a unit of data routing and management among the plurality of physical nodes, at least one of the plurality of virtual nodes is a metadata virtual node for data stored in an associated cache virtual node;

looking up an inode in an in-memory delta tree, wherein the in-memory delta tree captures modifications to the distributed storage system that are logged in a write log for the one of the plurality of virtual nodes by creating an in-memory clone inode for the one of the virtual nodes, logging an inode of a corresponding stripe snapshot in the write log, and creating a sibling for the corresponding stripe snapshot in the in-memory delta tree;

reading the data stored in the distributed storage system using keys from a delta-delta tree, wherein the delta-delta tree captures modifications to the in-memory delta tree since a time the snapshot was taken.

9. The computerized method of claim 8, wherein the in-memory delta tree is selected from the group consisting of an active delta tree and a passive delta tree.

10. The computerized method of claim 8, wherein the in-memory delta tree captures modifications to the distributed storage system that are logged in the write log.

11. The computerized method of claim 8, wherein the snapshot is read-only copy of an object at a given point of time.

12. A distributed storage system that creates an object snapshot of a source object in a distributed storage system, the distributed storage system comprising:
an interconnection network;
a plurality of virtual nodes, the plurality of virtual nodes are distributed across the plurality of physical nodes, each physical node owns a set of the virtual nodes, wherein each virtual node in the plurality of virtual nodes is part of a group of a plurality of active mirror virtual nodes that replicate data and metadata of the each virtual node in the plurality of virtual nodes, each of the plurality of virtual nodes is a unit of data routing and management among the plurality of physical nodes, at least one of the plurality of virtual nodes is a metadata virtual node for data stored in an associated cache virtual node; and
a plurality of storage controllers, interconnected by the interconnection network, wherein, the plurality of virtual nodes are distributed across the plurality of storage controllers, a logical address of the source object references a virtual block address of one of the plurality of virtual nodes, this virtual block address is mapped to a physical block address of one of the plurality of storage controllers, and each of the plurality of storage controllers includes,
a clone module that creates the object snapshot, the clone module including,
a receive request module that receives a request to create the object snapshot in the distributed storage system, a validate request module, coupled to the receive request module, that determines a set of virtual nodes from the plurality of virtual nodes, wherein each virtual node in the set of virtual nodes owns one of a plurality of stripes of the source object and each of the virtual nodes in the set of virtual nodes includes metadata about a modification to the distributed storage system that is logged into a write log of the distributed storage system for that virtual node, and a send operation module, coupled to the validate request module, that, for each virtual node of the set of virtual nodes, sends a clone request to that virtual node, the clone request is to create a stripe snapshot of a corresponding one of the plurality of stripes owned by that virtual node by creating an in-memory clone inode, logging an inode of the corresponding stripe snapshot in the write log, and creating a sibling for the corresponding stripe snapshot in an in-memory delta tree.

13. The distributed storage system of claim 12, wherein the object snapshot is read-only copy of the source object at a given point of time.

14. The distributed storage system of claim 12, wherein the each of the clone modules further comprises:

a reserve inode number module that reserves an inode number for an inode;

a log inode number module, coupled to the reserve inode number module, that logs the inode number for inode; and a prepare inode structure module, coupled to the log inode number module, that prepares an inode structure.

15. The distributed storage system of claim 12, wherein an in-memory delta tree captures modifications to the distributed storage system that are logged in the write log of the distributed storage system for the virtual node.

16. The distributed storage system of claim 12, wherein each of the clone modules further comprises:

a wakeup module that wakes up a storage controller server when responses are received from the set of virtual nodes.

\* \* \* \* \*